(12) United States Patent
Akamatsu et al.

(10) Patent No.: US 6,633,607 B1
(45) Date of Patent: Oct. 14, 2003

(54) SEMICONDUCTOR DEVICE HAVING A PLURALITY OF SEMICONDUCTOR CHIPS CONNECTED TOGETHER BY A BUS

(75) Inventors: Hironori Akamatsu, Hirakata (JP); Toru Iwata, Osaka (JP); Hiroyuki Yamauchi, Takatsuki (JP)

(73) Assignee: Matsushta Electric Co., Ltd., Osaka (JP)

( * ) Notice: Subject to any disclaimer, the term of this patent is extended or adjusted under 35 U.S.C. 154(b) by 0 days.

(21) Appl. No.: 09/249,695

(22) Filed: Feb. 12, 1999

(30) Foreign Application Priority Data

Feb. 13, 1998 (JP) .......................... 10-031734

(51) Int. Cl.[7] .................................. H03K 9/04
(52) U.S. Cl. .................. 375/239; 341/184; 382/245
(58) Field of Search ................ 375/239, 295, 375/316, 219; 332/112; 341/182, 184; 382/245

(56) References Cited

U.S. PATENT DOCUMENTS 5,020,077 A * 5/1991 Rhodes ...................... 375/222

FOREIGN PATENT DOCUMENTS

JP 2-310762 12/1990

* cited by examiner

Primary Examiner—Temesghen Ghebretinsae
Assistant Examiner—Pankaj Kumar
(74) Attorney, Agent, or Firm—RatnerPrestia

(57) ABSTRACT

A semiconductor device includes: a transmitting section; and a receiving section, wherein the transmitting section and the receiving section are connected to each other through a bus, the transmitting section includes an encoding section for encoding data including a plurality of bits to produce bit-position information which indicates a position of at least one bit selected from the plurality of bits included in the data, and an output section for outputting the bit-position information onto the bus, and the receiving section includes an input section for receiving the bit-position information from the bus, and a decoding section for decoding the bit-position information to produce the data.

7 Claims, 15 Drawing Sheets

*FIG.6A* REG00
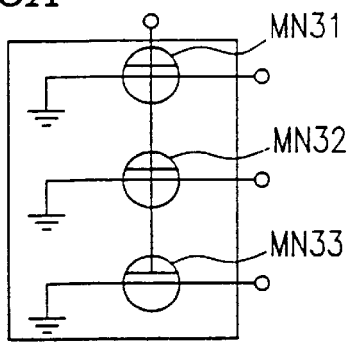
*FIG.6E* REG04
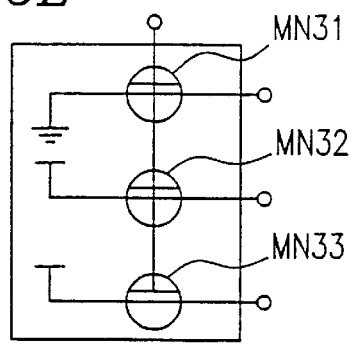
*FIG.6B* REG01
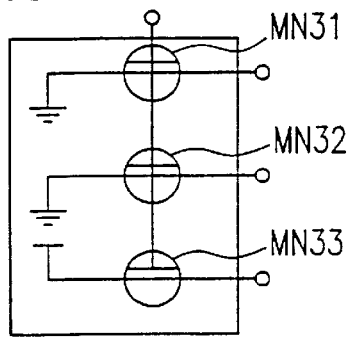
*FIG.6F* REG05
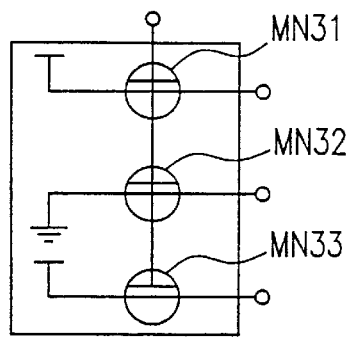
*FIG.6C* REG02
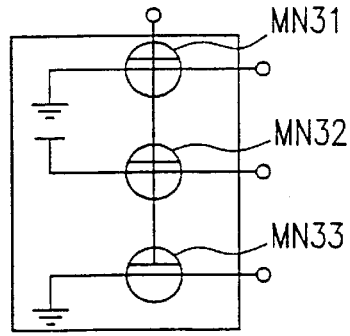
*FIG.6G* REG06
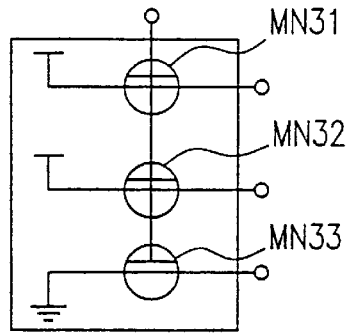
*FIG.6D* REG03
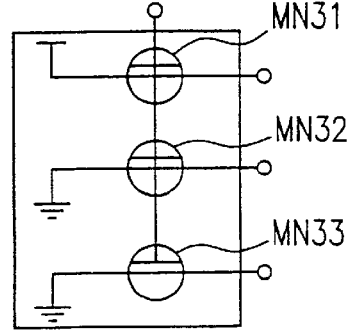
*FIG.6H* REG07
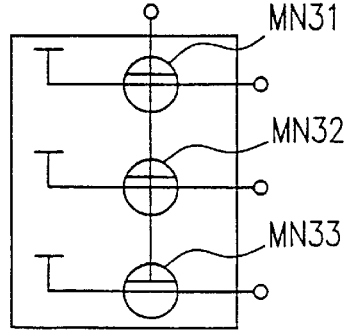

SEMICONDUCTOR DEVICE HAVING A PLURALITY OF SEMICONDUCTOR CHIPS CONNECTED TOGETHER BY A BUS

BACKGROUND OF THE INVENTION

1. Field of the Invention

The present invention relates to a semiconductor device. More particularly, the present invention relates to a semiconductor device including a plurality of semiconductor chips which are connected to each other through a bus having a larger width (i.e., having a number of buses) such as an address bus.

2. Description of the Related Art

Recently, a now field of technology called "multi-media" has be en developed. The important features of this technology includes its processing of dynamic images. In order to process the dynamic images, a huge amount of data must be transferred at a high speed. In order to satisfy this requirement, the width of a data bus for transferring the data has been often increased.

However, such an increase in width of the data bus leads to an increase in size of the semiconductor device. Therefore, a technique of suppressing the increase in size of the semiconductor device by sharing a data bus and an address bus has been developed.

However, such a conventional technique merely shares the data bus and the address bus, and cannot reduce the width of the data bus itself (or the address bus itself).

SUMMARY OF THE INVENTION

According to one aspect of the present invention, a semiconductor device includes a transmitting section; and a receiving section, wherein the transmitting section and the receiving section are connected to each other through a bus, the transmitting section includes an encoding section for encoding data including a plurality of bits to produce bit-position information which indicates a position of at least one bit selected from the plurality of bits included in the data, and an output section for outputting the bit-position information onto the bus, and the receiving section includes an input section for receiving the bit-position information from the bus, and a decoding section for decoding the bit-position information to produce the data.

In one example, the at least one bit is a bit having a specific logic value.

In one example, the at least one bit is a bit having a different logic value from a logic value of a corresponding bit of previous data.

In one example, the transmitting section further includes a bit-number comparison information producing section for producing bit-number comparison information indicating whether or not a number of bits having the specific logic value is larger than a number of bits having a logic value other than the specific logic value in the plurality of bits included in the data, the output section outputs the bit-position information and the bit-number comparison information onto the bus, the input section receives the bit-position information and the bit-number comparison information from the bus, and the decoding section decodes the bit-position information based on the bit-number comparison information to produce the data.

In one example, the encoding section encodes the data to produce a plurality of pieces of bit-position information, and the output section serially outputs the plurality of pieces of bit-position information onto the bus.

According to another aspect of the present invention, a semiconductor device connected to a bus includes an encoding section for encoding data including a plurality of bits to produce bit-position information which indicates a position of at least one bit, selected from the plurality of bits included in the data; and an output section for outputting the bit-position information onto the bus.

According to still another aspect of the present invention, a semiconductor device connected to a bus includes: an input section for receiving, from the bus, bit-position information which indicates a position of at least one bit selected from a plurality of bits included in data; and a decoding section for decoding the bit-position information to produce the data.

Hereinafter, functions of the present invention will be described.

According to a semiconductor device of the present invention, bit-position information, which indicates a position of at least one bit selected from a plurality of bits contained in the data, is produced, and the bit-position information is transmitted. Therefore, by using the bit-position information having a number of bits less than the number of bits of the data to be transferred, the content of the data is transmitted from a transmitting section to a receiving section. Thus, a bit width of a bus connecting the transmitting section with the receiving section can be made smaller than that of the data to be transmitted. For example, 8-bit data can be transmitted by using a 3-bit bus. As a result, the size of the semiconductor device can be reduced.

Thus, the invention described herein makes possible the advantage of providing a semiconductor device including a plurality of semiconductor chips which are connected to each other through a bus having a smaller width.

This and other advantages of the present invention will become apparent to those skilled in the art upon reading and understanding the following detailed description with reference to the accompanying figures.

BRIEF DESCRIPTION OF THE DRAWINGS

FIGS. 6A to 6H are circuit diagrams of respective structures of encoding elements ENC00 to ENC07 of FIG. 2;

DESCRIPTION OF THE PREFERRED EMBODIMENTS

Hereinafter, Examples of the present invention will be described with reference to the accompanying drawings.

EXAMPLE 1

Figure 1:
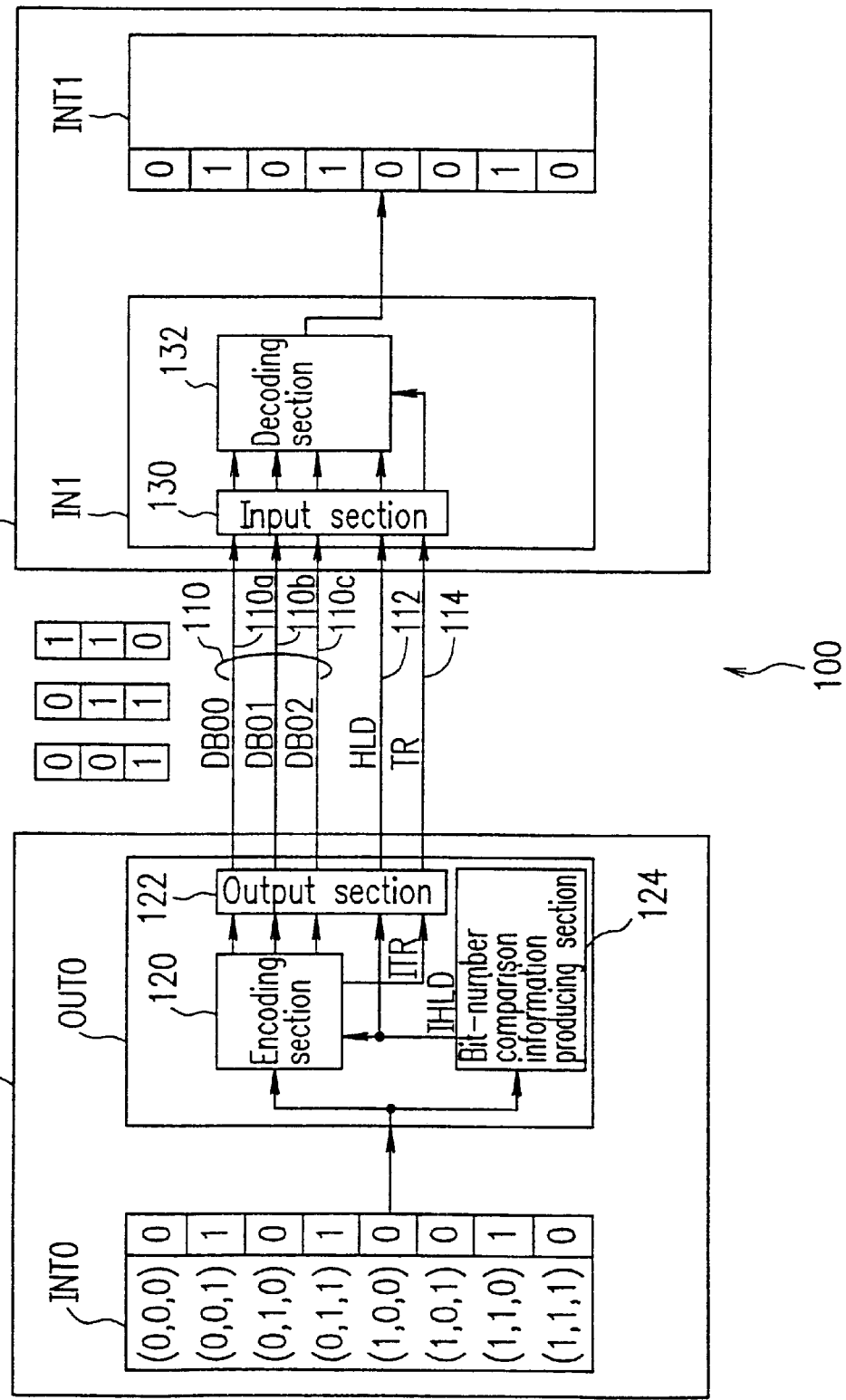
FIG. 1 is a block diagram of a structure of a semiconductor device 100 according to Example 1 of the present invention.

FIG. 1 shows a structure of a semiconductor device 100 according to Example 1 of the present invention. The semiconductor device 100 includes semiconductor chips CHIP0 and CHIP1. The semiconductor chips CHIP0 and CHIP1 are connected to each other through a bus 110. The bus 110 includes signal lines 110a, 110b and 110c. The bus 110 has a 3-bit width. 3-bit bit-position information (DB00, DB01, DB02) is transferred from the semiconductor chip CHIP0 to the semiconductor chip CHIP1 through the bus 110.

The semiconductor chip CHIP0 includes an internal circuit INT0 and an output circuit OUT0. The internal circuit INT0 produces 8-bit data. The output circuit OUT0 includes an encoding section 120 for encoding the 8-bit data produced by the internal circuit INT0 to produce bit-position information, and an output section 122 for outputting the bit-position information onto the bus 110. Thus, the semiconductor chip CHIP0 functions an a transmitting section for transmitting data.

The semiconductor chip CHIP1 includes an input circuit IN1 and an internal circuit INT1. The input circuit IN1 includes an input section 130 for receiving the bit-position information from the bus 110, and a decoding section 132 for decoding the received bit-position information to produce 8-bit data. The 8-bit data produced by the input circuit IN1 is output to the internal circuit INT1. Thus, the semiconductor chip CHIP1 functions as a receiving section for receiving data.

The bit-position information indicates a position of at least one bit which is selected from the 8 bits contained in the data produced by the internal circuit INT0. It is now assumed that the 8-bit data (0, 1, 0, 1, 0, 0, 1, 0) is produced by the internal circuit INT0. In this case, the respective positions of the bits having a logic value "1" are indicated by (0, 0, 1), (0, 1, 1) and (1, 1, 0). Accordingly, when a bit having a logic value "1" is selected, the encoding section 120 produces a plurality of pieces of bit-position information (0, 0, 1), (0, 1, 1) and (1, 1, 0) as information indicating the position of at least one bit which is selected, and the output section 122 serially outputs the plurality of pieces of bit-position information onto the bus 110.

Similarly, respective positions of the bits having a logic value "0" are indicated by (0, 0, 0), (0, 1, 0), (1, 0, 0), (1, 0, 1) and (1, 1, 1). Accordingly, when a bit having a logic value "0" is selected, the encoding section 120 produces a plurality of pieces of bit-position information (0, 0, 0), (0, 1, 0), (1, 0, 0), (1, 0, 1) and (1, 1, 1) as information indicating the position of at least one bit which is selected, and the output section 122 serially outputs the plurality of pieces of bit-position information onto the bus 110.

Thus, by transferring information indicating a position of a bit with a specific logic value in the 8-bit data (i.e., bit-position information) rather than by transferring the 8-bit data, data can be transferred through a bus having a smaller bit width than a bit width of data to be transferred. Thus, a bus width can be reduced as compared to a conventional example, whereby the size of the semiconductor device 100 can be reduced.

Data transfer efficiency can be improved by transferring 3-bit bit-position information instead of transferring 8-bit data. Hereinafter, an example in which the data transfer efficiency is improved will be described. Herein, bit patterns 00 to 08 of the 8-bit data are defined as follows:

| | |
|---|---|
| bit pattern 00: | all of the bits of the data have a logic value "1" (1 combination); |
| bit pattern 01: | one bit of the data has a logic value "1" (8 combinations); |
| bit pattern 02: | two bits of the data have a logic value "1" (28 combinations); |
| bit pattern 03: | three bits of the data have a logic value "1" (56 combinations); |
| bit pattern 04: | four bits of the data have a logic value "1" (70 combinations); |
| bit pattern 05: | five bits of the data have a logic value "1" (56 combinations); |
| bit pattern 06: | six bits of the data have a logic value "1" (28 combinations); |
| bit pattern 07: | seven bits of the data have a logic value "1" (8 combinations); and |
| bit pattern 08: | all of the bits of the data have a logic value "0" (1 combination). |

In order to transfer the bit patterns 00 to 08, 1 to 9 cycles are required, respectively. Provided that the respective probability that bit patterns 00 to 08 appear is 20%, 45%, 30%, 4%, 0.5%, 0.3%, 0.15%, 0.04% and 0.01%, the data is transferred in 2.22 cycles on average through a 3-bit data bus (i.e., through the bus 110). This is equivalent to transferring the data in a single cycle through a 6.66-bit data bus. Accordingly, the data transfer efficiency is improved by one or more bits of the data bus, as compared to the case of transferring the data in a single cycle through a 8-bit data bus.

The output circuit OUT0 may further include a bit-number comparison information producing section 124 for producing bit-number comparison information indicating whether or not the number of bits having a specific logic value in the 8-bit data produced by the internal circuit INT0 is larger than the number of bits having a logic value other than the specific logic value. For example, the specific logic value is "1".

In the following description, it is assumed that the bit-number comparison information is an internal HL (High/Low) deviation decision signal IHLD in the case where the specific logic value is "1". In other words, the internal HL deviation decision signal IHLD is a signal indicating whether or not the number of bits having a logic value "1" in the 8-bit data produced by the internal circuit INT0 is larger than the number of bits having a logic value "0".

When the number of bits having a logic value "1" in larger than the number of bits having a logic value "0", the internal HL deviation decision signal IHLD rises to a high ("H") level. Otherwise, the internal HL deviation signal IHLD falls to a low ("L") level. The internal HL deviation decision signal IHLD is supplied to the encoding section 120 and the output section 122.

The encoding section 120 is preferably configured to produce less pieces of bit-position information, according to the level of the internal HL deviation decision signal IHLD.

With such a configuration, the number of times to transfer the bit position information from the semiconductor chip CHIP0 to the semiconductor chip CHIP1 can be reduced. For example, when the internal HL deviation decision signal IHLD is at the "L" level, bit-position information indicating a position of a bit having a logic value "1" is produced. On the other hand, when the internal HL deviation decision signal IHLD is at the "H" level, bit-position information indicating a position of a bit having a logic value "0" is produced. Thus, the number of pieces of bit-position information produced by the encoding section 120 can be reduced to four or less, regardless of the level of the internal HL deviation decision signal IHLD.

The output section 122 outputs the internal HD deviation decision signal IHLD onto a signal line 112 as an HL deviation decision signal HLD.

The encoding section 120 produces an internal data transfer control signal ITR for controlling transfer of the bit-position information. The internal data transfer control signal ITR is supplied to the output section 122. The output section 122 outputs the internal data transfer control signal ITR onto a signal line 114 as a data transfer control signal TR.

The input section 130 receives the bit-position information from the bus 110, receives the HL deviation decision signal HLD from the signal line 112 and receives the data transfer control signal TR from the signal line 114.

The decoding section 132 decodes the bit-position information according to the level of the HL deviation decision signal HLD. For example, when the HL deviation decision signal HLD is at the "L" level, the decoding section 132 interprets the bit-position information an indicating a position of a bit having a logic value "1", and encodes the bit-position information accordingly. When the HL deviation decision signal HLD in at the "H" level, the decoding section 132 interprets the bit-position information as indicating a position of a bit having a logic value "0", and encodes the bit-position information accordingly. Such an interpretation of the HL deviation decision signal HLD must be predetermined between the encoding section 120 for transmitting the HL deviation decision signal HLD and the decoding section 132 for receiving the HL deviation decision signal HLD.

Data transfer efficiency can be improved by transferring 3-bit bit-position information and the 1-bit HL deviation decision signal HLD instead of transferring 8-bit data. Hereinafter, an example in which the data transfer efficiency is improved will be described. Herein, bit patterns 10 to 14 of the 8-bit data are defined as follows:

| | |
|---|---|
| bit pattern 10: | all of the bits of the data have a logic value "0" or "1" (2 combinations); |
| bit pattern 11: | one bit of the data has a logic value "0" or "1" (16 combinations); |
| bit pattern 12: | two bits of the data have a logic value "0" or "1" (56 combinations); |
| bit pattern 13: | three bits of the data have a logic value "0" or "1" (112 combinations); |
| and | |
| bit pattern 14: | four bits of the data have a logic value "0" or "1" (70 combinations); |

In order to transfer the bit patterns 10 to 14, 1 to 5 cycles are required, respectively. Provided that the respective probability that bit patterns 10 to 14 appear is 40%, 50%, 6%, 3.9% and 0.1%, the data is transferred in 1.74 cycles on average through a 4-bit data bus (i.e., through the signal line 112 and the bus 110). This is equivalent to transferring the data in a single cycle through a 6.96-bit data bus. Accordingly, the data transfer efficiency is improved by one or more bits of the data bus, as compared to the case of transferring the data in a single cycle through a 8-bit data bus.

In the case where all of the bits in the data produced by the internal circuit INT0 have a logic value "1" (or a logic value "0"), the bit-position information is not transferred. In this case, the output circuit OUT0 need only inform the input circuit IN1 that the bit-position information is not transferred, by using the data transfer control signal TR. The logic value (i.e., "1" or "0") of each bit can be determined by useing the HL deviation decision signal HLD.

It should be noted that the bus 110 for transferring the bit-position information (DB00, DB01, DB02), the signal line 112 for transferring the HL deviation decision signal HLD, and the signal line 114 for transferring the data transfer control signal TR may be at least partially shared with an address-bus line. Such sharing of the signal lines between the semiconductor chips CHIP0 and CHIP1 allows for a reduction in area required to provide the signal lines. An a result, the size of the semiconductor device 100 can be reduced.

In the example shown in FIG. 1, the number of bits of the data produced by the internal circuit INT0 is 8, whereas the number of bits of the bit-position information transferred from the semiconductor chip CHIP0 to the semiconductor chip CHIP1 is 3. However, the present invention is not limited to such numbers of bits. The internal circuit INT0 may produce data having any number of bits. Moreover, bit-position information having any number of bits may be transferred from the semiconductor chip CHIP0 to the semiconductor chip CHIP1.

Figure 2:
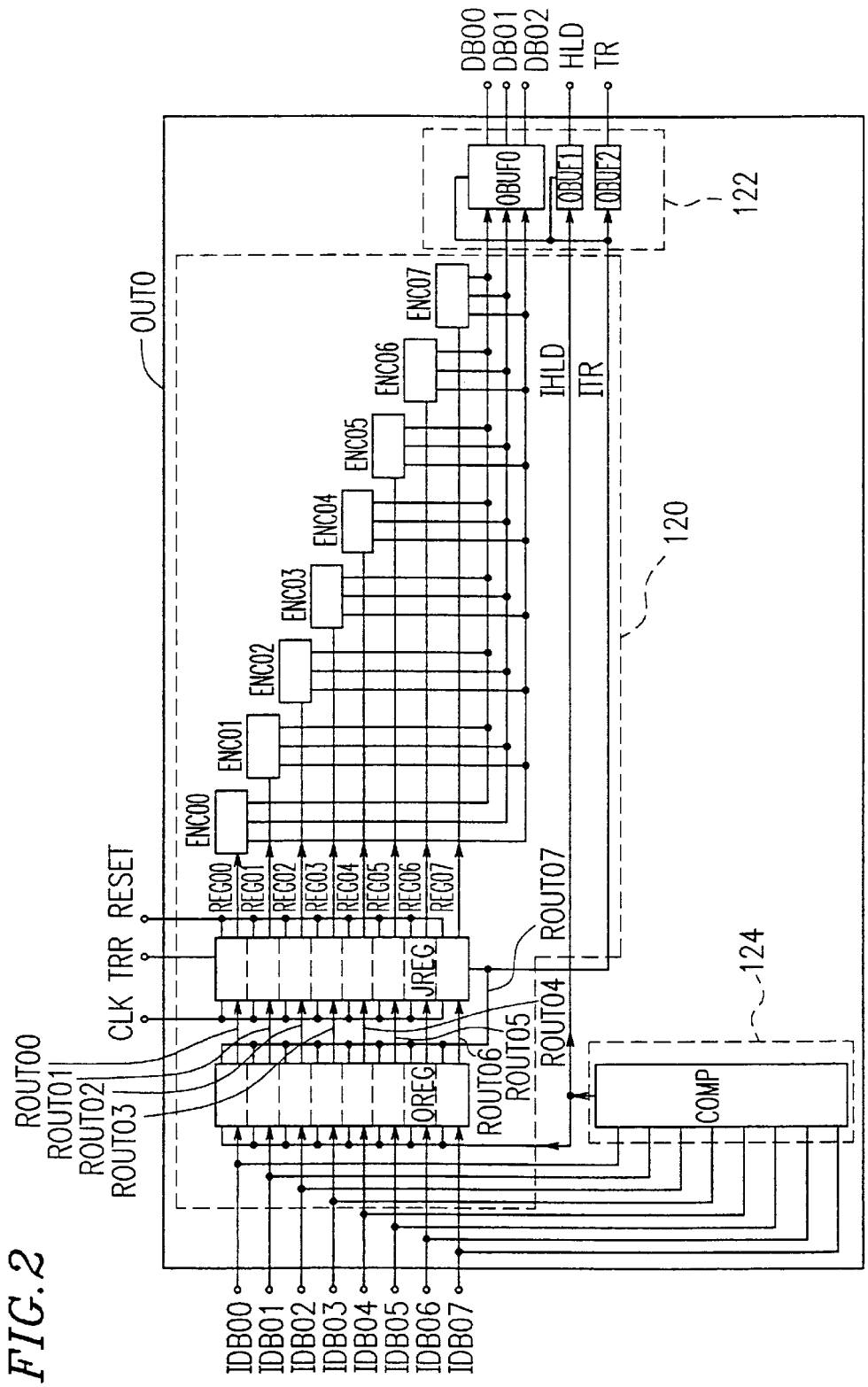
FIG. 2 is a block diagram of a structure of an output circuit OUT0 of a semiconductor chip CHIP0 of FIG. 1.

FIG. 2 shows a structure of the output circuit OUT0 of the semiconductor chip CHIP0 shown in FIG. 1.

The encoding section 120 includes an output data holding circuit OREG, a jump shift-register JREG and encoding elements ENC00 to ENC07.

The output section 122 includes output buffers OBUF0, OBUF1 and OBUF2.

The bit-number comparison information producing section 124 includes an HL deviation decision circuit COMP.

The output circuit OUT0 receives the 8-bit data output from the internal circuit INT0 of the semiconductor chip CHIP0. In FIG. 2, the a bits in the 8-bit data are respectively denoted by IDB00 to IDB07. The 8-bit data is input to the output data holding circuit OREG and the HL deviation decision circuit COMP.

The HL deviation decision circuit COMP compares the number of bits having a logic value "1" (i.e., "H"-level bits) with the number of bits having a logic value "0" (i.e., "L"-level bits) in the 8-bit input data. When the number of "H"-level bits is larger than that of "L"-level bits, the HL deviation decision circuit COMP outputs the internal HL deviation decision signal IHDL at the "H" level. On the other hand, when the number of "L"-level bits is larger than that of "H"-level bits, the HL deviation decision circuit COMP outputs the internal HL deviation decision signal IHLD at the "L"-level.

The output data holding circuit OREG latches the data output from the internal circuit INT0 at the timing when the internal data transfer control signal ITR rises to the "H" level, and holds the latched data.

The internal data transfer control signal ITR in output from the jump shift-register JREG. The timing when the internal data transfer control signal ITR first rises to the "H" level is determined in response to a data latch signal TRR. The timing when the internal data transfer control signal ITR subsequently risen to the "H" level is determined by the jump shift-register JREG.

The output data holding circuit OREG is responsive to the internal HL deviation decision signal IHLD at the "H" level to invert the respective logic values of the bits IDB00 to IDB07 in the data, thereby outputting the bits having inverted logic values to the jump shift-register JREG as bits ROUT00 to ROUT07. On the other hand, the output data holding circuit OREG is responsive to the internal HL deviation signal IHLD at the "L" level to output the bits IDB00 to IDB07 to the jump shit -register JREG without inversion as bits ROUT00 to ROUT07.

Accordingly, when the number of "H"-level bits is larger than that of "L"-level bits in the bits IDB00 to IDB07 contained in the data, the "H"-level bit(s) is inverted to be output as the "L"-level bit(s), whereas the "L"-level bit(s) is inverted to be output as the "H"-level bit(s). When the number of "L"-level bits is larger than that of "H"-level bits in the bits IDB00 to IDB07, such an inverting operation is not conducted.

The Jump shift-register JREG receives the bits ROUT00 to ROUT07 output from the output data holding circuit OREG, and sequentially selects the "H"-level bit (s) therefrom in synchronization with a clock signal CLK, thereby rendering a selection signal(s) corresponding to the selected "H"-level bit(s) at the "H" level.

For example, when only the bit ROUT00 of the bits ROUT00 to ROUT07 is at the "H" level, the jump shift-register JREG renders a selection signal REG00 corresponding to the bit ROUT00 at the "H" level.

For example, when only the bits ROUT01 and ROUT02 of the bits ROUT00 to ROUT07 are at the "H" level, the jump shift-register JREG sequentially renders selection signals REG01 and REG02 corresponding to the respective bits ROUT01 and ROUT02 at the "H" level in synchronization with the clock signal CLK.

Each of the encoding elements ENC00 to ENC07 outputs a 3-bit position signal which indicates a position of the respective encoding element itself, in response to a corresponding one of the selection signals REG00 to REG07. More specifically, when a selection signal REG0k is at the "H" level, an encoding element ENC0k outputs to the output buffer OBUF0 a 3-bit position signal Sk which indicates a position of the encoding element ENC0k (where k is an integer of 0 to 7)

Such a position signal indicates a position of an encoding element which receives an "H"-level selection signal. Accordingly, the position signal indicates a position of an "H"-level bit out of the bits ROUT00 to ROUT07. The position(s) of the "H"-level bit(s) out of the bits ROUT00 to ROUT07 indicates a position(s) of the "L"-level bit s) when the number of "H"-level bits is larger than that of "L"-level bits, and otherwise, indicates a position(s) of the "H"-level bit(s).

When the 3-bit position signal is output from any one of the encoding elements ENC00 to ENC07, the position signal is temporarily stored in the output buffer OBUF0. After the fall of the internal data transfer control signal ITR, the position signal stored in the buffer OBUF0 is output as bit-position information (DB00, DB01, DB02) in synchronization with the clock signal CLK.

When a plurality of position signals are sequentially input to the output buffer OBUF0, these position signals are sequentially output an a plurality of pieces of bit-position information (DB00, DB01, DB02) in synchronization with the clock signal CLK.

The internal HL deviation decision signal IHLD is output as the HL deviation decision signal HLD through the output buffer OBUF1. The internal data transfer control signal ITR is output as the data transfer control signal TR through the output buffer OBUF2.

Thus, the bit-position information (DB00, DB01, DB02), the data transfer control signal TR, and the HL deviation decision signal HLD which are output from the output circuit OUT of the semiconductor chip CHIP0 are transferred to the semiconductor chip CHIP1.

In the present example, the 8-bit data is encoded into 3-bit bit-position information (DB00, DB01, DB02), which in turn is transferred from the semiconductor chip CHIP0 to the semiconductor chip CHIP1 through the bus 110. The bit-position information indicates a position(s) of an "H"-level (or "L"-level) bit(s) of the 8-bit data. In the case where information indicating the position(s) of the "H"-level bit(s) is transferred as the bit-position information, information indicating the position(s) of the "L"-level bit(a) is not transferred. On the other hand, in the case where the information indicating the position(s) of the "L"-level bit(s) is transferred as the bit-position information, the information indicating the position(s) of the "H"-level bit(s) is not transferred. This is because the position(s) of the "L"-level bit(a) (or "H"-level bit(s) is determined by transferring only the information indicating the position(s) of the "H"-bit (or "L"-bit) position(s).

Moreover, the number of "H" bits in the data is compared with the number of "L" bits in the data, whereby a smaller number of bits is detected. Then, according to the detection result, information indicating a position(s) of the smaller number of bits is output as the bit-position information. Thus, the number of times to transfer the bit-position information can be reduced. As a result, the amount of data transferred between the semiconductor chips CHIP0 and CHIP1 can be reduced.

Figure 3:
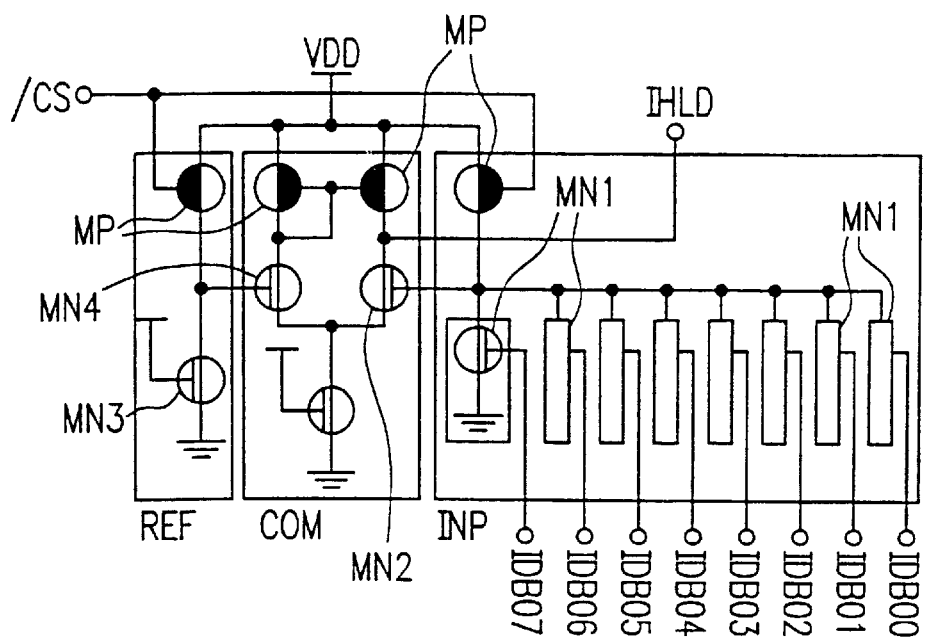
FIG. 3 is a circuit diagram of a structure of an HL (High/Low) deviation decision circuit COMP of FIG. 2.

FIG. 3 shows a structure of the HL deviation decision circuit COMP shown in FIG. 2. In FIG. 3, INP denotes an input voltage generating circuit, COM denotes a current-mirror type comparison circuit, REF denotes a reference voltage generating circuit, VDD denotes a first power supply, MP denotes a PMOS transistor, MN1 to MN4 denote NMOS transistors, and /CS denotes a chip select signal.

The input voltage generating circuit INP includes a single PMOS transistor MP and eight NMOS transistors MN1. The bits IDB00 to IDB07 of the data from the internal circuit INT0 of the semiconductor chip CHIP0 are respectively applied to the respective gates of the NMOS transistors MN1. Each of the NMOS transistors MN1 is turned ON in response to a respective "H" bit. As the number of the NMOS transistors MN1 which are turned ON is increased, a gate voltage of the NMOS transistor MN2 of the comparison circuit COM is reduced accordingly.

The reference voltage generating circuit REF includes a single PMOS transistor HP and a single NMOS transistor MN3. A constant voltage is applied to the gate of the NMOS transistor MN3. A constant voltage is also applied to the gate of the NMOS transistor MN4 of the comparison circuit COM.

When each NMOS transistor MN1 of the input voltage generating circuit INP is compared with the NMOS transistor MN3 of the reference voltage generating circuit INP, the amount of current flowing across the NMOS transistor MN3 is about 4.5 times larger than that flowing across each NMOS transistor MN1. Therefore, in the case where four or less of the NMOS transistors MN1 in the input voltage generating circuit INP are turned ON, a current flowing across the NMOS transistor MN3 of the reference voltage generating circuit REF is larger than the total current flowing across the NMOS transistors MN1. Therefore, in the comparison circuit COMP, a gate voltage of the NMOS transistor MN4 becomes lower than a gate voltage of the NMOS transistor MN2. In the case where five or more of the NMOS transistors MN1 of the input voltage generating circuit INP are turned ON, a current flowing across the NMOS transistor MN3 of the reference voltage generating circuit REF is smaller than the total current flowing across the NMOS transistors MN1 of the input voltage generating circuit INP. Therefore, in the comparison circuit COM, the gate voltage of the NMOS transistor MN4 becomes higher than the gate voltage of the MNOS transistor MN2.

In such a structure, when the chip select signal/CS falls to the "L" level, each of the PMOS transistors MP in turned ON, whereby the HL deviation decision circuit COMP is activated. In this state, when four or less of the bits IDB00 to IDB07 of the data from the internal circuit INT0 of the semiconductor chip CHIP0 rise to the "H" level, four or less of the NMOS transistors MN1 of the input voltage generating circuit INP are turned ON. As a result, in the comparison circuit COM, the gate voltage of the NMOS transistor MN4 becomes lower than the gate voltage of the NMOS transistor MN2. In response to this state, the comparison circuit COM outputs the internal HL deviation decision signal IHLD at the "L" level.

Moreover, when five or more of the bits IDB00 to IDB07 of the data from the internal circuit INT0 of the semiconductor chip CHIP0 rise to the "H" level, five or more of the NMOS transistors MN1 of the input voltage generating circuit INP are turned ON. As a result, in the comparison circuit COM, the gate voltage of the NMOS transistor MN4 becomes higher than the gate voltage of the NMOS transistor MN2. In response to this state, the comparison circuit COM outputs the internal HL deviation decision signal IHLD at the "H" level.

Thus, the HL deviation decision circuit COMP compares the number of "H" bits with the number of "L" bits in the data output from the internal circuit INT0. Then, the HL deviation decision circuit COMP outputs the internal HL deviation decision signal IHLD at the "H" level when the number of "H" bits is larger than the number of "L" bits, while outputting the internal HL deviation decision signal IHLD at the "L" level when the number of "H" bits is smaller than the number of "L" bit.

Figure 4:
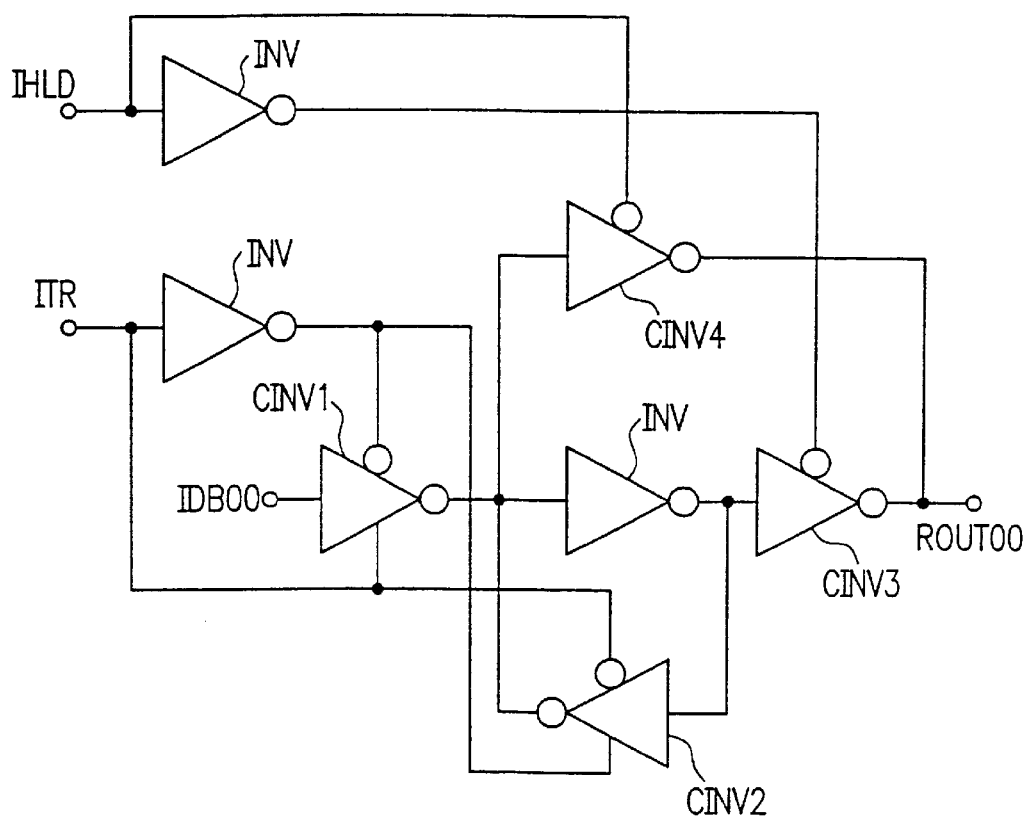
FIG. 4 is a circuit diagram of a structure of a portion of an output data holding circuit OREG of FIG. 2.

FIG. 4 shows a partial structure of the output data holding circuit OREG of FIG. 2. The circuit shown in FIG. 4 is provided so as to correspond to the bit IDB00 of the data which is input to the output data holding circuit OREG. Circuits similar to the circuit of FIG. 4 are provided so as to correspond to other seven bits of the data which is input to the output data holding circuit OREG, respectively. Accordingly, eight circuits each as shown in FIG. 4 are provided in the output data holding circuit OREG.

In FIG. 4, INV denotes an inverter circuit, and CINV1 to CINV4 denote clock-controlled inverter circuits.

When the internal data transfer control signal ITR rises to the "H" level while the internal HL deviation decision signal IHLD is at the "H" level, the single bit IDB00 of the data is sequentially transmitted to and inverted by the clock-controlled inverter circuit CINV1, the inverter circuit INV and the clock-controlled inverter circuit CINV3 in this order, whereby the resultant bit IDB00 is output as a bit ROUT00.

On the other hand, when the internal data transfer control signal ITR rises to the "H" level while the internal HL deviation decision signal IHLD is at an "L" level, the single bit IDB00 of the data is output as the bit ROUT00 without inversion through the clock-controlled inverter circuits CINV1 and CINV4.

Thus, when the internal HL deviation decision signal IHLD is at the "H" level, the output data holding circuit OREG inverts respective logic values of the bits IDB00 to IDB07 of the data, and outputs the resultant bits having the respective inverted logic values as bits ROUT00 to ROUT07. On the other hand, when the internal HL deviation decision signal IHLD is at the "L" level, the output data holding circuit OREG outputs the bits IDB00 to IDB07 as the bits ROUT00 to ROUT07 without inversion.

Figure 5:
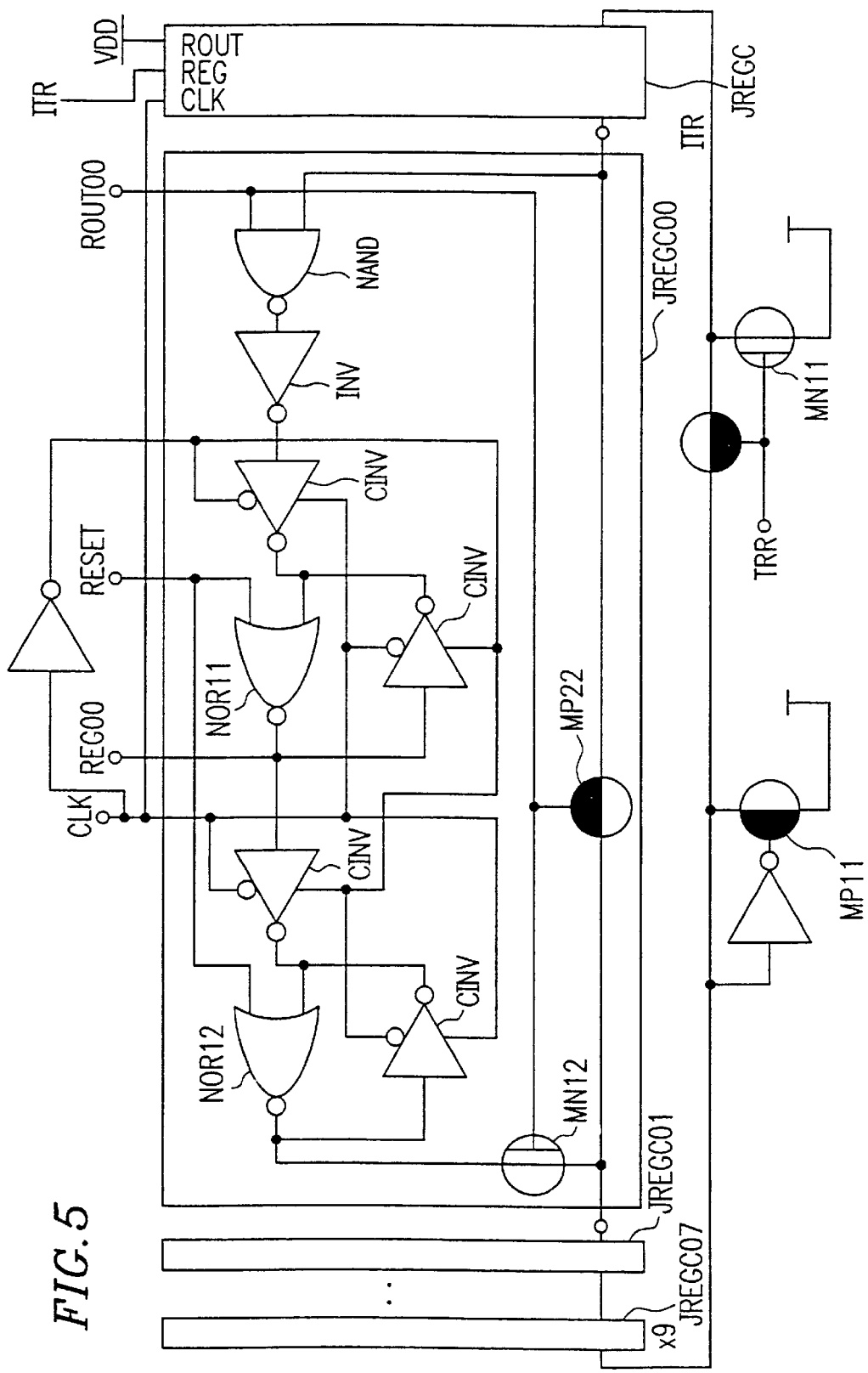
FIG. 5 is a circuit diagram of a structure of a jump shift-register JREG of FIG. 2.

FIG. 5 shows the jump shift-register JREG shown in FIG. 2. In FIG. 5, JREGC and JREGC00 to JREGC07 denote circuits in respective stages of the jump shift-resister JREG, NAND denotes a two-input NAND circuit, NOR denotes a two-input NOR circuit, INV denotes an inverter circuit, CINV denotes a clock-controlled inverter circuit, and REG00 to RBG07 (REG01 to RBG07 are not shown in detail for simplicity) denote respective outputs of the circuits JREGC00 to JREGC07.

The jump shift-register JREG includes the circuits JREGC00 to JREGC07 and JREGC. These circuits are connected in series with each other. The circuits JREGC00 to JREGC07 are provided so as to correspond to the respective bits ROUT00 to ROUT07 output from the output data holding circuit OREG. The first-stage circuit JREGC of the jump shift-register JREG is provided as a dummy circuit. In place of the bit from the output data holding circuit OREG. a signal at the "H"-level (i.e., a voltage VDD) is always input to the circuit JREGC. When the internal data transfer control signal ITR rises to the "H" level, an "H" bit is applied to the second- and the following-stage circuits JREGC00 to JREGC07 , thereby making the circuits JREGC00 to JREGC07 ready for an output operation after the next rise of the clock signal CLK.

The internal data transfer control signal ITR first rises to the "H" level in synchronization with the data latch signal TRR, while subsequently rising to the "H" level in response to a bit from the last-stage circuit JREGC07. When the data latch signal TRR first rises to the "H" level, the NMOS transistor MN11 is turned ON. As a result, the internal data transfer control signal ITR rises to the "H" level. Subsequently, the PMOS transistor MP11 is turned ON every time an "H"-level bit is output from the last-stage circuit JREGC07. As a result, the internal data transfer control signal ITR rises to the "H" level.

When an "H"-level bit is output from the first-stage circuit JREGC, the next-stage circuit JREGC00 inputs the "H"-level bit to the NAND circuit NAND and the NMOS transistor MN12. As a result, the MNOS transistor MN12 is turned ON. The "H" bit as well as the bit ROUT00 from the output data holding circuit OREG are input to the NAND circuit NAND. Therefore, when the bit ROUT00 in at the "H" level, the NAND circuit NAND outputs an "L"-level bit. A NOR circuit NOR11 responsively outputs a selection signal REG00 at the "H" level upon the next rise of the clock signal CLK. At the same time, the NOR circuit NOR12 also outputs an "H"-level bit, which in turn in output to the following-stage circuit JREGC01 through the NMOS transistor MN12.

In the case where the bit ROUT00 is at the "L" level, the NAND circuit NAND outputs an "H"-level bit, and the NOR circuit NOR11 responsively outputs a selection signal REG00 upon the next rise of the clock signal CLK.

On the other hand, in the case where the bit ROUT00 is at the "H" level, the NMOS transistor MN12 is turned OFF. Therefore, the "L"-level bit from the NOR circuit NOR12 is not output to the subsequent-stage circuit JRRGC02. Instead, the PMOS transistor MP22 in turned ON, whereby an "H"-level bit is output from the first-stage circuit JREGC to the subsequent-stage circuit JREGC02 through the PMOS transistor MP22. It should be noted that the transmission of "H"-level bit from the first-stage circuit JREGC to the subsequent-stage circuit JREGC02 is immediately carried out without waiting for the rise of the clock signal CLK.

Similarly, for each of the circuits JREGC01 to JREGC07, when the circuit receives an "H"-level bit ROUT from the output data holding circuit OREG, the circuit outputs a selection signal REG at the "H"-level in response to the next rise of the clock signal CLK after the reception of the "H"-level bit, while simultaneously outputting the "H"-level bit to a subsequent-stage circuit JREGC. Moreover, when the circuit receives an "L"-level bit ROUT from the output data holding circuit OREG, the circuit immediately transmits an "H"-level bit to a subsequent-stage circuit JREGC, and outputs an "L"-level bit REG in response to the next rise of the clock signal CLK.

Thus, when the jump shift-register JREG receives the bits ROUT00 to ROUT07 from the output data holding circuit OREG the jump shift-register JREG sequentially selects an "H"-level bit(s) from the bits ROUT00 to ROUT07, thereby rendering a selection signal(s) REG corresponding to the selected bit(s) at an "H" level.

FIGS. 6A to 6H show circuit structures of the encoding elements ENC00 to ENC07 shown in FIG. 2, respectively. In FIGS. 6A to 6H, MN31 to MN33 denote NMOS transistors.

In each of the encoding elements ENC00 to ENC07, either a ground potential or a power supply potential is selectively applied to each of the respective inputs of three NMOS transistors MN31 to MN33, whereby the encoding elements ENC00 to ENC07 have different combinations of the potentials applied to the respective inputs of the NMOS transistors MN31 to MN33. For example, in the encoding element ENC00 of FIG. 6A, the ground potential is applied to all of the respective inputs of the three NMOS transistors MN31 to MN33. On the other hand, in the encoding element ENC05 of FIG. 6F, the ground potential is applied to the respective inputs of the two NMOS transistors MN31 and MN33, whereas the power supply voltage is applied to the input of the NMOS transistor MN32.

In each of the encoding elements ENC00 to ENC07, when a selection signal REG at the "H" level is applied from the jump shift-register JREG to the respective gates of the three NMOS transistors MN31 to MN33, these NMOS transistors MN31 to MN33 are turned ON, whereby respective potentials at the inputs of the NMOS transistors MN31 to MN33 are output as a 3-bit position signal.

Thus, each of the encoding elements ENC00 to ENC07 outputs a 3-bit position signal indicating a position of the encoding element itself, when a corresponding one of the selection signals REG00 to REG07 rises to the "H" level.

With such a structure, the number of "H"-level bits in the 8-bit data is compared with the number of "L"-level bits in the 8-bit data, whereby bit-position information indicating a position(s) of a smaller number of bits can be output, an well as the HL deviation decision signal HLD indicating whether the bit-position information indicates a position(s) of an "H"-level bit (s) or an "L"-level bit(s) can be output.

Figure 7:
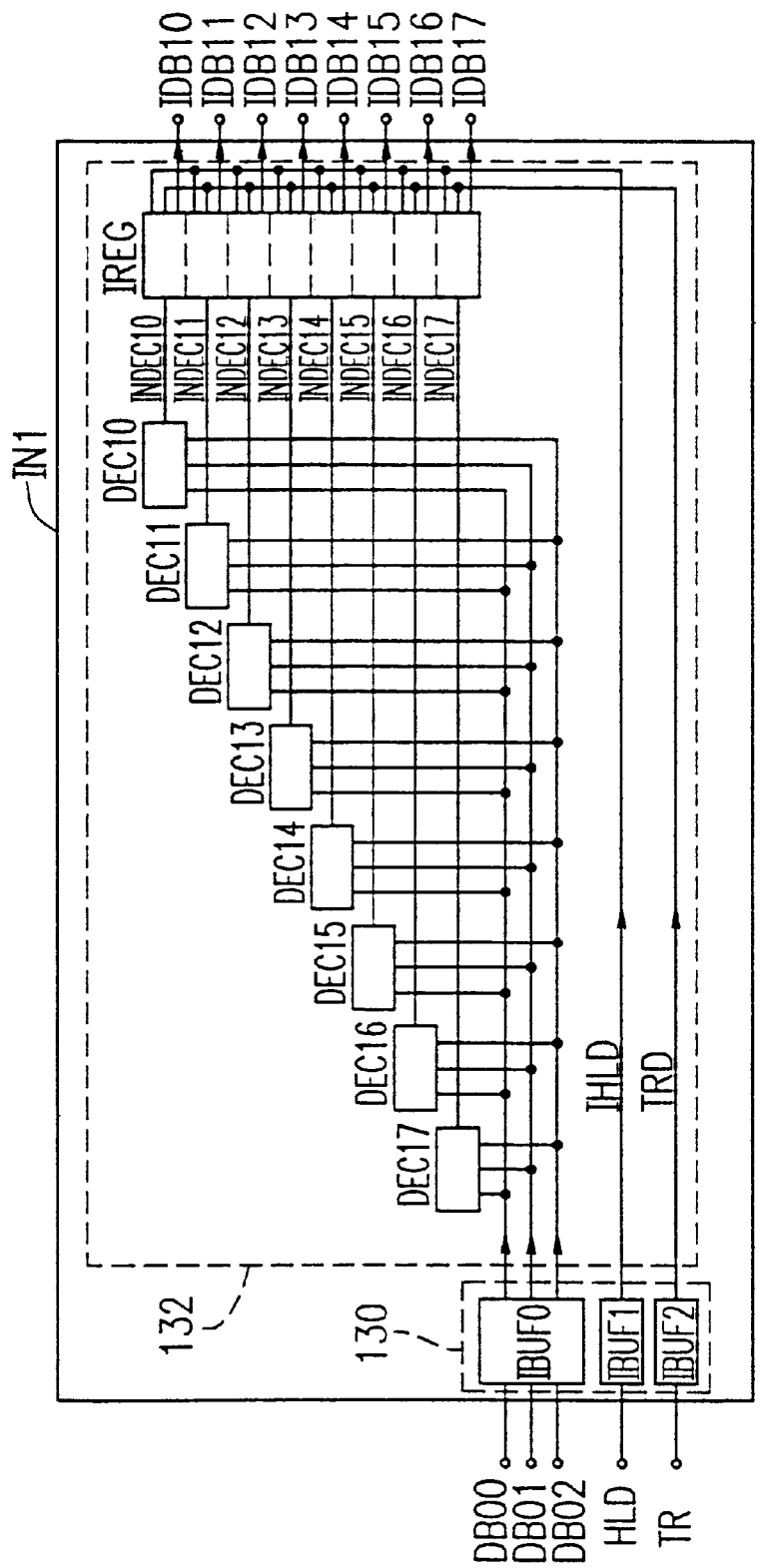
FIG. 7 is a block diagram of a structure of ant input circuit IN1 of the semiconductor chip CHIP1 of FIG. 1.

FIG. 7 shows a structure of the input circuit IN1 shown in FIG. 1. The input circuit IN1 decodes 3-bit bit-position information (DB00, DB01, DB02) input to the semiconductor chip CHIP1 into 8-bit data, and transfers the 8-bit data to the internal circuit INT1.

The input circuit INT1 includes the input section 130 and the decoding section 132.

The input section 130 includes input buffers IBUF0, IBUF1 and IBUF2.

The decoding section 132 includes the input data holding circuit IREG and decoding elements DEC10 to DEC17.

The 3-bit bit-position information (DB00, DB01, DB02) transferred from the output circuit OUT of the semiconductor chip CHIP0 through the bus 110 is input to the decoding elements DEC10 to DEC17 through the input buffer IBUF0. Every time the 3-bit bit-position information (DB00, DB01, DB02) is input, the bit-position information (DB00 DB01, DB02) is decoded by a corresponding one of the decoding elements DEC10 to DEC17. As a result, a corresponding one of bits INDEC10 to INDEC17 rises to the "H" level so as to be input to the input data holding circuit IREG. INDEC10 to INDEC17 denote the respective bits output from the decoding elements DEC10 to DEC17.

The HL deviation decision signal HLD transferred from the output circuit OUT of the semiconductor chip CHIP0 through the signal line 112 is input to the input buffer IBUF1, and is output to the input data holding circuit IREG as the internal HL deviation decision signal IHLD.

The data transfer control signal TR transferred from the output circuit OUT0 of the semiconductor chip CHIP0 through the signal line 114 is input to the input buffer IBUF2, and is output to the input data holding circuit IREG as the internal data transfer control signal TRD.

When the internal HL deviation decision signal IHLD at the "H" level is input to the input data holding circuit IREG (i.e., when the bits of the data are transferred from the semiconductor chip CHIP0 to the input data holding circuit IREG with their respective logic values being inverted), the input data holding circuit IREG inverts the respective logic values of the bits INDEC10 to INDEC17 output from the respective decoding elements DEC10 to DEC17, thereby producing bits IDB10 to IDBI7 respectively having the same logic value as that of the original data. The bits IDB10 to IDB17 are output to the internal circuit INT1 of the semiconductor chip CHIP1.

When the internal HL deviation decision signal IHLD at the "L" level is input to the input data holding circuit IREG (i.e., when the bits of the data are transferred without inversion from the semiconductor chip CHIP0 to the input data holding circuit IREG), the input data holding circuit IREG outputs the bits INDEC10 to INDEC17 output from the respective decoding elements DEC10 to DEC17 as bits IDB10 to IDB17 without inversion. Thus, the bits IDB10 to IDB17 respectively having the same logic value as that of the original data can be obtained. The bits IDB10 to IDB17 are output to the internal circuit INT1 of the semiconductor chip CHIP1.

The input data holding circuit IREG is reset in response to a period during which the internal data transfer control signal TRD is at the "H" level. Thereafter, the input data holding circuit IREG operates in response to the bits INDEC10 to INDEC17 output from the respective decoding elements DEC10 to DEC17.

In order to synchronize the input timing of the internal data transfer control signal TRD to the input data holding circuit IREG with the input timing of the bits INDEC10 to INDEC17 from the respective decoding elements DEC10 to DEC17 to the input data holding circuit IREG, the input buffer IBUF2 is used to delay the data transfer control signal TR by prescribed delay time. Such a delayed data transfer control signal TR is output as the internal data transfer control signal TRD.

The bits IDB10 to IDB17 of the input data holding circuit IREG are latched in the internal circuit INT1 of the semiconductor chip CHIP1 at the timing when the input data holding circuit IREG in reset by the internal data transfer control signal TRD.

Thus, every time the 3-bit bit-position information (DB00, DB01, DB02) is input from the semiconductor chip CHIP0 to the input circuit IN1 of the semiconductor chip CHIP1, the input circuit SN1 decodes the bit-position information by using a corresponding one of the decoding elements DEC10 to DEC17, thereby producing the bits INDEC10 to INDEC17. Moreover, the input circuit IN1 inverts or does not invert the respective logic values of the bits INDEC10 to INDEC17 depending upon the level of the internal HL deviation decision signal IHLD, thereby producing the bits IDB10 to IDB17 respectively having the same logic value as that of the original data.

FIGS. 8A to 8H show respective circuit structures of the decoding elements DEC10 to DEC17.

Figure 8A:
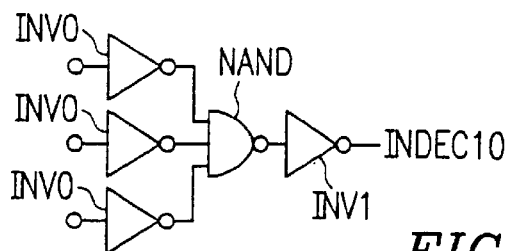
FIGS. 8A to 8H are circuit diagram of respective structures of decoding elements DEC10 to DEC17 of FIG. 7.

For example, the decoding element DEC10 of FIG. 8A includes three inverter circuits INV0, a NAND circuit NAND and an inverter circuit INV1, and corresponds to the encoding element ENC00 of FIG. 6A. The decoding element DEC10 of FIG. 8A outputs the bit INDEC10 at the "H" level in response to the reception of the 3-bit bit-position information (DB00, DB01, DB02) produced by the encoding element ENC00 of FIG. 6A.

Figure 8B:
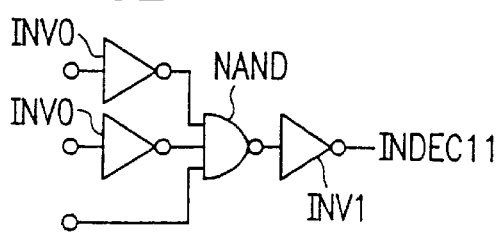
Figure 8C:
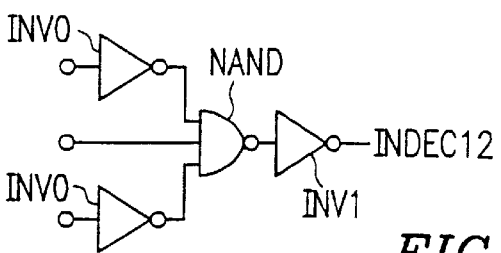
Figure 8D:
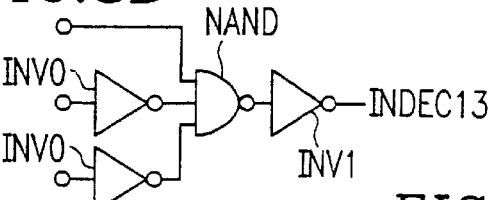
Figure 8E:
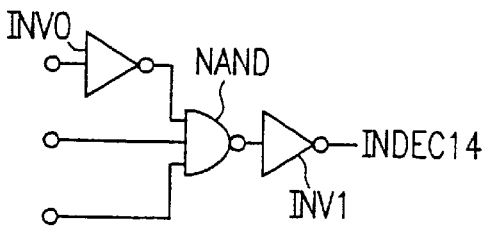
Figure 8F:
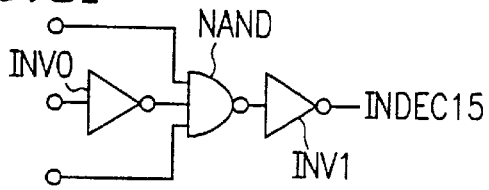
Figure 8G:
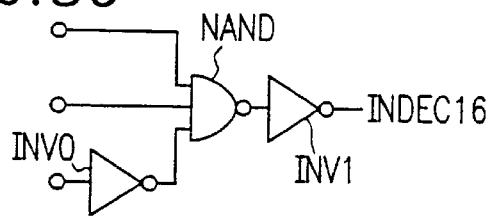
Figure 8H:
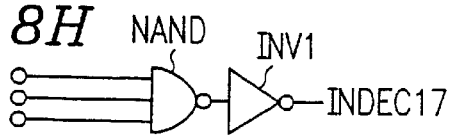

The decoding element DEC11 of FIG. 8B includes two inverter circuits INV0, a NAND circuit NAND and an inverter circuit INV1, and corresponds to the encoding element ENC01 of FIG. 6B. The decoding element DEC11 of FIG. 8B outputs the bit INDEC11 at the "H" level in response to the reception of the 3-bit bit-position information (DB00, DB01, DB02) produced by the encoding element ENC01 of. FIG. 6B.

Thus, the encoding elements DEC10 to DEC17 convert the respective 3-bit bit-position information into 8-bit data.

Figure 9:
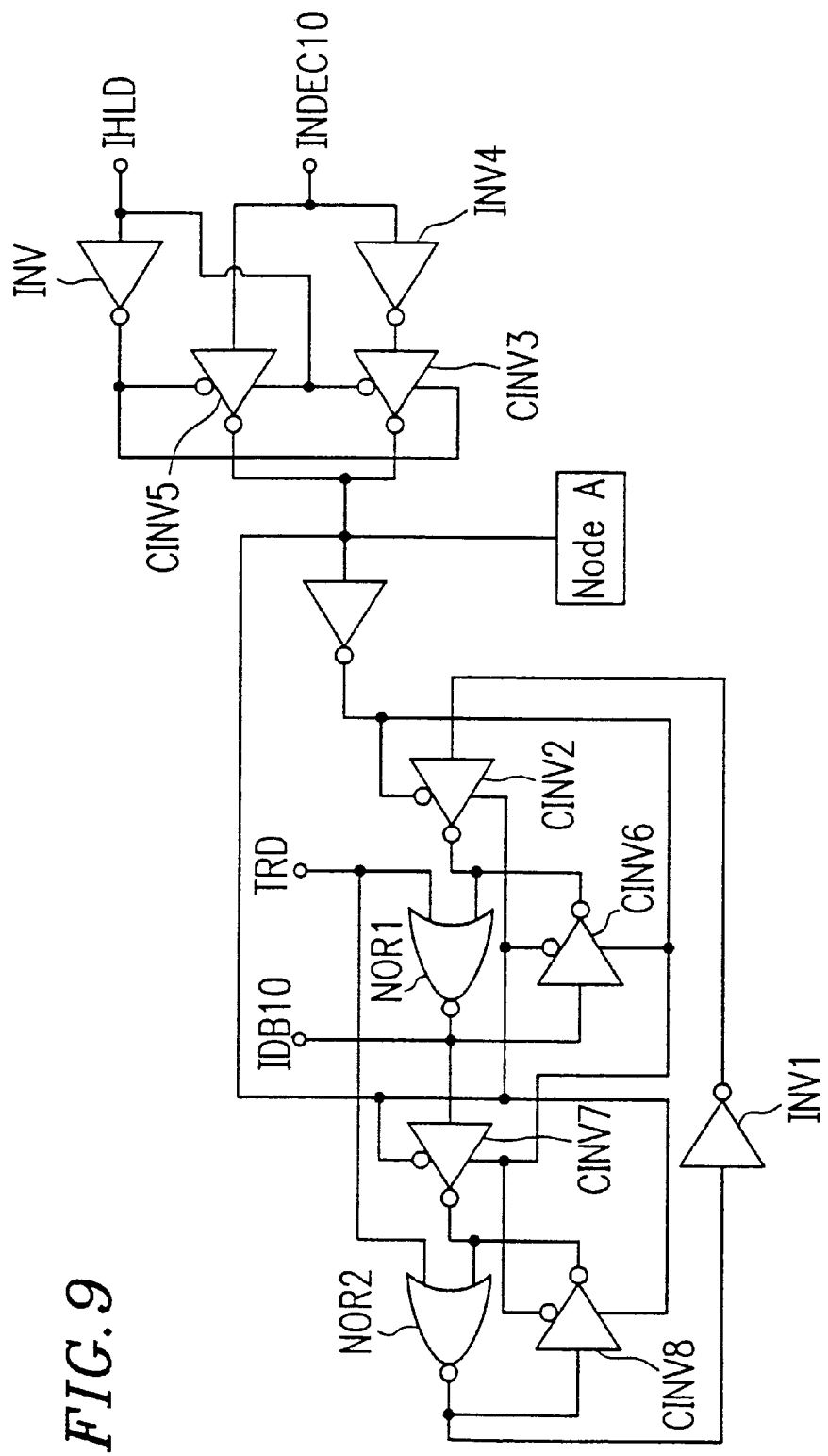
FIG. 9 is a circuit diagram of a structure of a portion of an input data holding circuit IREG, of FIG. 7.

FIG. 9 shows a partial structure of the input data holding circuit IREG of FIG. 7. In FIG. 9, NOR denotes a NOR circuit, CINV denotes a clock-controlled inverter, and INV denotes an inverter.

The circuit shown in FIG. 9 is provided so as to correspond to the bit INDEC10 output from the decoding element DEC10. Circuits similar to the circuit of FIG. 9 are provided so as to correspond to the bits INDEC11 to INDEC17 which are respectively output from the other decoding elements DEC11 to DEC17. Accordingly, eight circuits each as shown in FIG. 9 are provided in the input data holding circuit IREG.

The circuit of FIG. 9 is reset in response to the rise of the internal data transfer control signal TRD, thereby outputting the bit IDB10 at the "L" level. It is now assumed that the circuit of FIG. 9 is reset while receiving the internal HL deviation decision signal IHLD at the "L" level. In this case, when the circuit of FIG. 9 receives the bit INDEC10 at the "L". level from the decoding element DEC10, the circuit outputs the "L" level bit IDB10 without inversion. On the other hand, when the circuit of FIG. 9 receives the bit INDEC10 at the "H" level from the decoding element DEC10, the circuit inverts the logic value of the bit IDB10, thereby outputting the bit IDB10 at the "H" level.

It is now assumed that the circuit of FIG. 9 is reset while receiving the internal data transfer control signal TRD at the "H" level. In this case, the circuit of FIG. 9 inverts the logic value of the bit IDB10 in response to the fall of the internal data transfer control signal TRD, thereby outputting the bit IDB10 at the "H" level. When the circuit receives the bit INDEC10 at the "L" level from the decoding element DEC10, the circuit outputs the bit IDB10 without inversion. When the circuit receives the bit IDB10 at the "H" level from the decoding element DEC10, the circuit inverts the logic value of the bit IDB10, thereby outputting the bit IDB10 at the "L" level.

Such an operation is conducted for each of the bits INDEC10 to INDEC17 output from the respective decoding elements DEC10 to DEC17. As a result, the bits INDEC10 to INDEC17 are output from the input data holding circuit IREG.

In the circuit of FIG. 9, the deviation decision signal IHLD is used to control whether the bit INDEC10 input to the data input terminal is output to the output terminal IDB10 with or without inversion.

More specifically, when the deviation decision signal IHLD is at the "H" level, the bit INDEC10 is input to the data input terminal through the inverter CINV5. When the deviation decision signal IHLD is at the "L" level, the bit INDEC10 is input to the data input terminal through two stages of inverters, i.e., through the inverter INV4 and the inverter CINV3.

In the case where the data on a node A is at the "H" level, the inverters CINV2 and CINV8 are activated, whereas the inverters CINV6 and CINV7 are deactivated. As a result, in the case where the internal data transfer control signal TRD rises to the "H" level and the circuit is reset, the bit IDB10 is rendered at the "H" level.

In the case where the data on the node A is at the "L" level, the inverters CINV2 and CINV8 are deactivated, whereas the inverters CINV6 and CINV7 are activated. As a result, in the case where the internal data transfer control signal TRD rises to the "H" level and the circuit is reset, the bit IDB10 is rendered at the "H" level.

Figure 10:
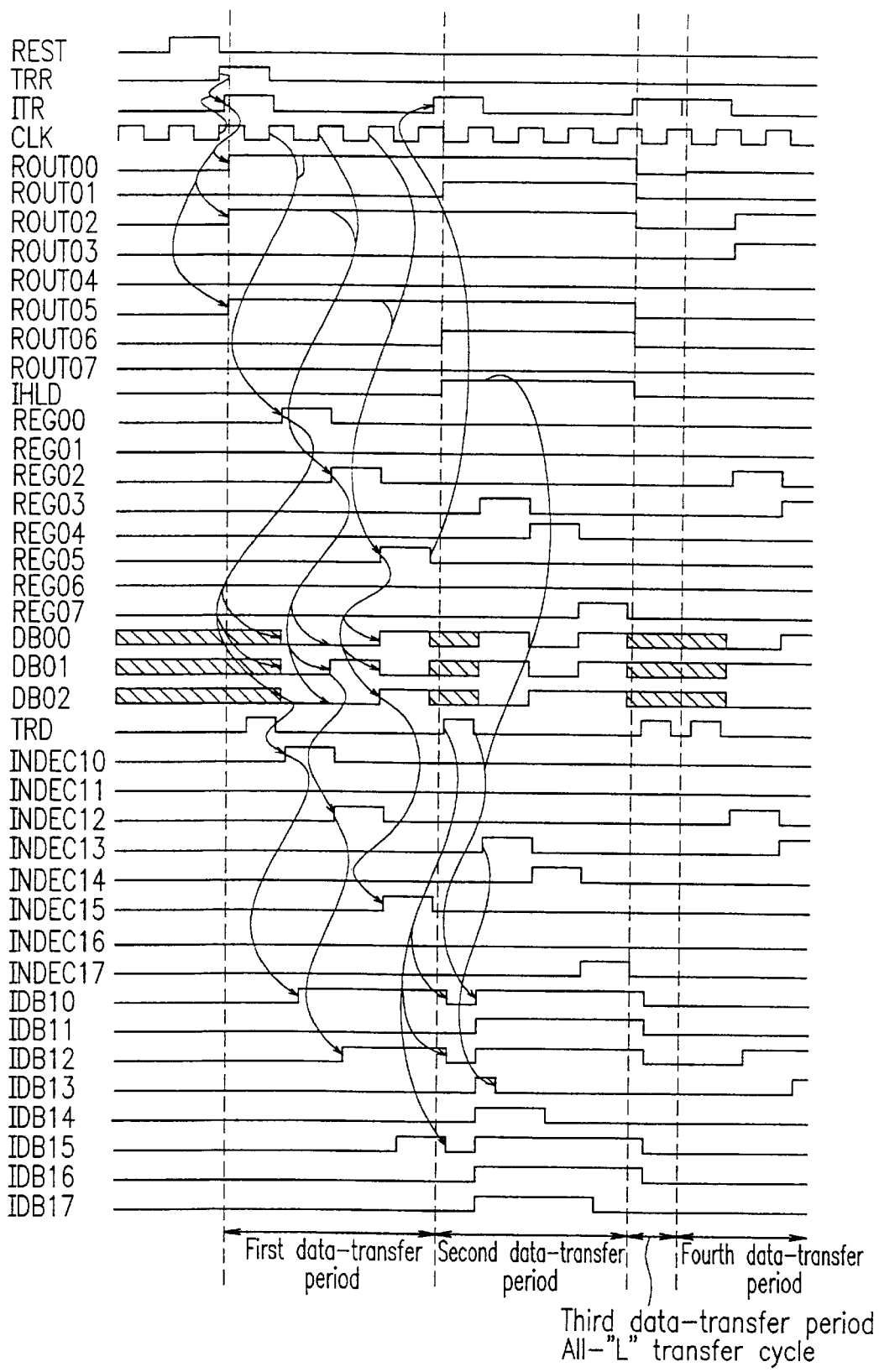
FIG. 10 is a timing chart illustrating an operation of an output circuit OUT0 and an input circuit IN1 of FIG. 1.

FIG. 10 is a timing chart illustrating an operation of the output circuit OUT0 of the semiconductor chip CHIP0 and the input circuit IN1 of the semiconductor chip CHIP1.

In the semiconductor chip CHIP0, when the internal data transfer control signal ITR rises to the "H" level, the bits ROUT00 to ROUT07 are output from the output data holding circuit OREG. After the next rise of the clock signal CLK, only an "H"-level selection signal(s) of the selection signal REG00 to REG07 is sequentially output from the jump shift-register JREG in synchronization with the clock signal CLK. Every time the "H"-level selection signal is output from the jump shift-register JREG, 3-bit bit-position information (DB00, DB01, DB02) are output.

In the semiconductor chip CHIP1, the internal data transfer control signal TRD is produced by delaying the data transfer control signal TR. When the internal data transfer control signal TRD falls to the "L" level, an "H" level bit(s) of the bits INDEC10 to INDEC17 is sequentially input to the input data holding circuit IREG every time the 3-bit bit-position information (DB00, DB01, DB02) is input. Until the internal data transfer control signal TRD rises to the "H" level, the input data holding circuit IREG continues to output the bits IDB10 to IDB17 respectively having the same value as that of the original data.

It should be noted that, in FIG. 10, a slight amount of time passes until the bit INDEC10 to INDEC17 appear after the fall of the internal data transfer control signal TRD. The reason for this is as follows: in the case where the internal HL deviation decision signal IHLD at the "H" level is input (i.e., in the case where the number of "H"-level bits is larger than that of "L"-level bits in the data), the bits IDB10 to IDB17 are simultaneously rewritten to the "H" level after the bits INDEC10 to INDEC17 output from the respective decoding elements DEC10 to DEC17 are reset to the "L" level. In the case where a large number of "H"-level bits are contained in the data, only information indicating a position (s) of the "L"-level bit(s) is transferred, whereas information indicating the respective positions of the "H"-level bits is not transferred. By using the above-described timing, the input data holding circuit IREG shown in FIG. 9 operates desirably.

In FIG. 10, a third data-transfer period is a period during which ALL-"L" data (i.e., data in which all of the bits have a logic value "0") is transferred. During the third data-transfer period, the HL deviation decision signal HLD and the data transfer control signal TR are output from the transmitting semiconductor chip CHIP0, whereas the bit-position information is not output. The bit-position information is "UNKNOWN". In this state, in the receiving semiconductor chip CHIP1, all of the data in the input data holding circuit IREG has been reset in response to the internal data transfer control signal TRD. As a result, all of the bits IDB10 to IDB17 output from the input data holding circuit IREG have been rendered at the "L" level. The data in the input data holding circuit IREG is again reset in response to the next input of the data transfer control signal TR. At the same time, the data in the input data holding circuit IREG is latched by the internal circuit INT1. Thus ALL-"L" data has been transferred. It should be noted that ALL-"H" data (i.e., data in which all of the bits have a logic value "1") is transferred in a similar manner. However, in the case of the ALL-"H" data, a timing margin for rendering all of the bits IDB10 to IDB17 at the "H" level after the reception of the HL deviation decision signal HLD must be by the time the nest data transfer control signal TR is input.

According to Example 1, in the case where all of the bits IDB00 to IDB07 in the data are at the "L" level, only a reset operation by the data transfer control signal TR is conducted without transferring the bit-position information. In other words, since the internal HL deviation decision signal IHLD at the "L" level is input to. the input data holding circuit IREG, the input data holding circuit IREG outputs the "L"-level bits IDB00 to IDB07 without inversion, after the reset by the data transfer control signal TR.

In the case where all of the bits IDB00 to IDB07 in the data are at the "H" level, the internal HL deviation decision signal IHLD at the "H" level is input to the input data holding circuit IREG. Therefore, the input data holding circuit IREG simultaneously inverts the respective logic values of the bits IDB00 to IDB07 after the reset by the data transfer control signal TR, thereby outputting the bits IDB00 to IDB07 at the "H" level.

As can be seen from the above, in the semiconductor device of Example 1, 8-bit data is encoded into 3-bit bit-position information. The 3-bit bit position information is transferred through the bus. Then, the 3-bit bit-position information is decoded into the 8-bit data. Thus, the number of signal lines required for data transfer can be reduced.

Moreover, the number of "H" bits is compared with the number of "L" bits, whereby information indicating a positions) of the less number of bits is transferred together with the HL deviation decision signal HLD. An a result, effective data transfer can be achieved.

It should be noted that the circuits shown in FIGS. 2 to 9 are by way of illustration only, and various modifications can be made to the present invention. Alternatively, instead of these circuits, elements having similar functions may be used.

EXAMPLE 2

Figure 11:
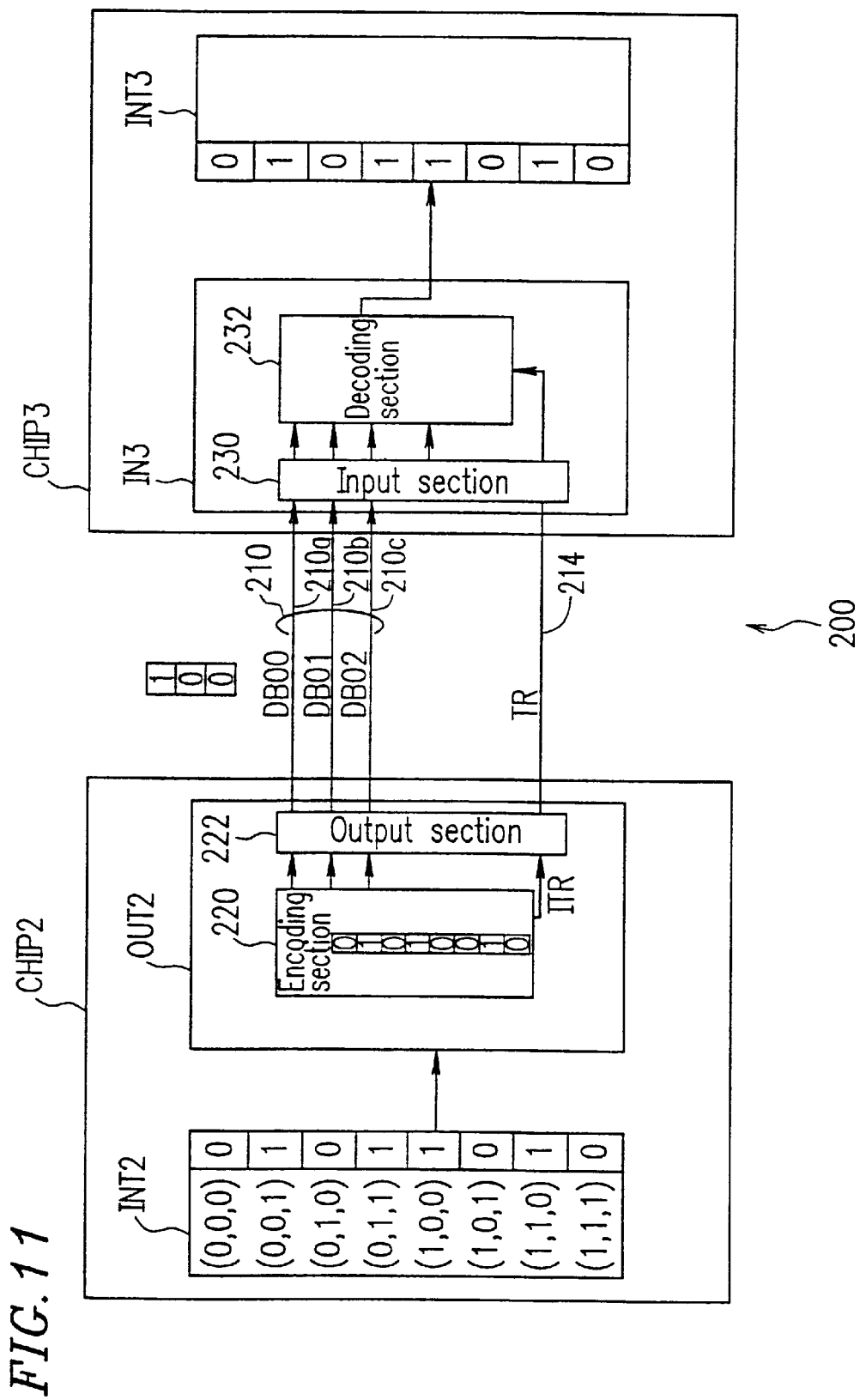
FIG. 11 is a block diagram of a structure of a semiconductor device 200 according to Example 2 of the present invention.

FIG. 11 shows a structure of a semiconductor device 200 according to Example 2 of the present invention. The semiconductor device 200 provides an advantage that a signal line for transferring the HL deviation decision signal HLD between semiconductor chips CHIP2 and CHIP3 is not necessary. Thus,the area required to provide the signal lines can be reduced, thereby achieving a reduction in size of the semiconductor device 200.

In the semiconductor device 200, the data to be transferred this time is compared with the previously transferred data in terms of a logic value on a bit-by-bit basis. As a result, a bit(s) having a different logic value from that of a corresponding bit(s) of the previously transferred data is selected, and information indicating a position(s) of the selected bit(s) is transferred.

The semiconductor device 200 includes the semiconductor chips CHIP2 and CHIP3. The semiconductor chips CHIP2 and CHIP3 are connected with each other through a bus 210. The bus 210 includes signal lines 210a, 210b and 210c. The bus 210 has a 3-bit width. Therefore, 3-bit bit-position information (DB00, DB01, DB02) is transferred from the semiconductor chip CHIP2 to the semiconductor chip CHIP3 through the bus 210.

The semiconductor chip CHIP2 includes an internal circuit INT2 and an output circuit OUT2. The internal circuit INT2 produces 8-bit data. The output circuit OUT2 includes an encoding section 220 for encoding the 8-bit data produced by the internal circuit INT2 to produce bit-position information, and an output section 222 for outputting bit-position information onto the bus 210. Thus, the semiconductor chip CHIP2 functions as a transmitting section for transmitting data.

The semiconductor chip CHIP3 includes an input circuit IN3 and an internal circuit INT3. The input circuit IN3 includes an input section 230 for receiving the bit-position information from the bus 210, and a decoding section 232 for decoding the received bit-position information to produce 8-bit data. The 8-bit data produced by the input circuit IN3 is output to the internal circuit INT3. Thus, the semiconductor chip CHIP3 functions as a receiving section for receiving data.

The bit-position information indicates a position(s) of a bit(s) having a different logic value from that of a corresponding bit (s) of the previously transferred data. For example, it in assumed that the previously transferred 8-bit data is (0, 1, 0, 1, 0, 0, 1. 0) and the 8-bit data to be transferred this time 18 (0, 1, 0, 1, 1, 0, 1, 0). In this case, the positions of the bits having a different logic value from that of the corresponding bits of the previously transferred 8-bit data can be represented by (1, 0, 0). Therefore, the encoding section 220 produces the bit-position information (1, 0, 0), and the output section 222 outputs this bit-position information onto the bus 210.

It should be noted that the 8-bit data to be transferred this time is produced by the internal. circuit INT2, and is supplied to the output circuit OUT2. The previously transferred 8-bit data is held within the encoding section 220 of the output circuit OUT2.

The encoding section 220 produces an internal data transfer control signal ITR for controlling transfer of the bit-position information. The internal data transfer control signal ITR is supplied to the output section 222. The output section 222 outputs the internal data transfer control signal ITR onto a signal line 214 as a data transfer control signal TR.

Thus, instead of transferring the 8-bit data, information indicating a position(s) of a bit(s) which have a different logic value from that of a corresponding bit (s) of the previously transferred data (i.e., bit-position information) is transferred, whereby the data can be transferred by using a bus having a smaller bit width than that of the data to be transferred. As a result, the bus width can be reduced an compared to a conventional example, thereby achieving a reduction in size of the semiconductor device 200.

Data transfer efficiency can be improved by transferring 3-bit bit-position information instead of transferring 8-bit data. Hereinafter, an example in which the data transfer efficiency is improved will be described. Herein, bit patterns 20 to 28 of the 8-bit data are defined as follows:

| bit pattern 20: | data is the same as that of the previously transferred data (1 combination); |
|---|---|
| bit pattern 21: | data is different by one bit from the previously transferred data (8 combinations); |
| bit pattern 22: | data is different by two bits from the previously transferred data (28 combinations); |
| bit pattern 23: | data is different by three bits from the previously transferred data (56 combinations); |
| bit pattern 24: | data is different by four bits from the previously transferred data (70 combinations); |
| bit pattern 25: | data is different by five bits from the previously transferred data (56 combinations); |
| bit pattern 26: | data is different by six bits from the previously transferred data (28 combinations); |
| bit pattern 27: | data is different by seven bits from the previously transferred data (8 combinations); and |
| bit pattern 28: | data is entirely different from the previously transferred data (1 combination). |

In order to transfer the bit patterns 20 to 28, 1 to 9 cycles are required, respectively. Provided that the respective probability that bit patterns 20 to 28 appear is 50%, 40%, 8%, 1.5%, 0.4%, 0.08%, 0.015%, 0.004% and 0.001%, the data is transferred in 1.63 cycles on average through a 3-bit data bus (i.e., through the bus 210). This is equivalent to transferring the data in a single cycle through a 4.89-bit data bus. Accordingly, the data transfer efficiency is improved by three or more bits of the data bus, as compared to the case of transferring the data in a single cycle through a 8-bit data bus.

Figure 12:
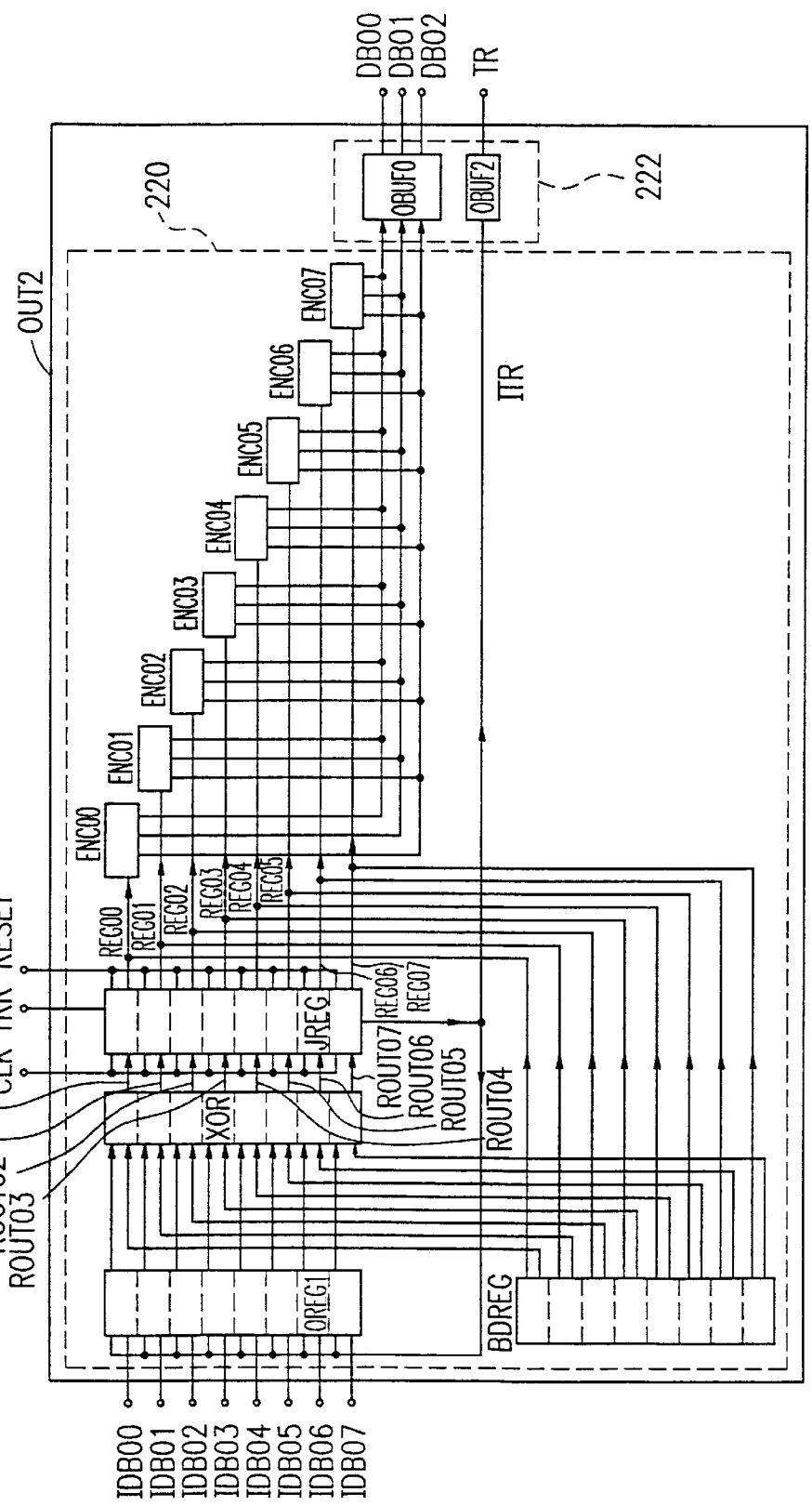
FIG. 12 is a block diagram of a structure of an output circuit OUT2 of a semiconductor chip CHIP2 of FIG. 11.

FIG. 12 shows a structure of the output circuit OUT2 of FIG. 11, The structure of the output circuit OUT2 shown in FIG. 12 is different from that of the output circuit OUT0 shown in FIG. 2 in that the HL deviation decision circuit COMP and the output buffer OBUF1 are eliminated, as well as in that a previous-data holding circuit BDREG for holding each of the bits in the previously transferred data, and an exclusive OR circuit XOR for comparing the bits of the data to be transferred this time with the bits of the previously transferred data, are added.

It should be noted that, in FIG. 12, elements having the same functions as those of the output circuit OUT2 shown in FIG. 2 are denoted by the same reference numerals and characters, and description thereof is omitted f or simplification.

In the output circuit OUT2 of FIG. 12, the previous-data holding circuit BDREG and an output data holding circuit OREG1 are initialized by a reset signal RESET. Thus, the bits of the data hold in the previous-data holding circuit BDREG as well as the bits of the data hold in the output data holding circuit OREG1 are initialized to the "L" level.

Then, data produced by the internal circuit INT of the semiconductor chip CHIP2 is input to and held in the output data holding circuit OREG1. The exclusive OR circuit XOR compares the data held in the previous-data holding circuit BDREG with the data held in the output data holding circuit OREG1 on a bit-by-bit basis in the order that the bits are arranged. In the case where a logic value(s) of a bit(s) held in the output data holding circuit OREG1 is different from that of a corresponding bit(s) held in the previous-data holding circuit BDREG, the exclusive OR circuit XOR renders a bit(s) corresponding to the bit(s) having a different logic value to the "H" level, thereby outputting the resultant data to the Jump shift-register JREG. It should be noted that the bits output from the exclusive OR circuit XOR are represented as bits ROUT07 to ROUT07.

The jump shift-register JREG sequentially select an "H"-level bit(s) from the bits ROUT00 to ROUT07 in synchronization with a clock signal CLK, and renders a selection signal(s) corresponding to the selected bit(s) at the "H" level.

The previous-data holding circuit BDREG updates the data held in the previous-data holding circuit BDREG by inverting a logic value(s) of the bit(s) corresponding to the "H"-level selection signal(s) out of the selection signals REGC00 to REGC07. Thus, the data held in the previous-data holding circuit BDREG are sequentially updated.

Each of the encoding elements ENC00 to ENC07 outputs a 3-bit position signal indicating a position of the encoding element itself, in response to the rise of its corresponding selection signal to the "H" level.

The 3-bit position signal(a) output from any of the encoding elements ENC00 to ENC07 is temporarily stored in the output buffer OBUF0. Then, after the fall of the internal data transfer control signal ITR, the 3-bit position signal(s) stored in the output buffer OBUF0 is output as bit-position information (DB00, DB01, DB02) onto the bus 210 in synchronization with the clock signal CLK.

In the case where a plurality of position signals are stored in the output buffer OBUF0, the plurality of position signals are sequentially output as a plurality of pieces of bit-position information (DB00, DB01, DB02) in synchronization with the clock signal CLK.

Figure 13:
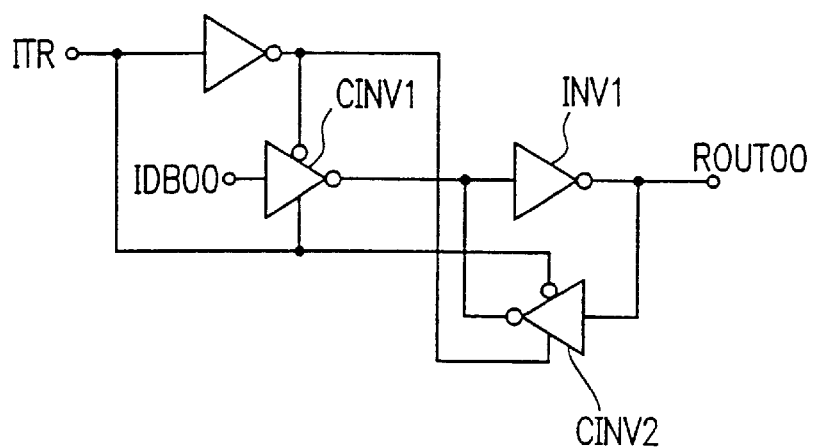
FIG. 13 is a circuit diagram of a structure of a portion of an output data holding circuit OREG1 of FIG. 12.

FIG. 13 shows a partial structure of the output data holding circuit OREG1 of FIG. 12. The circuit shown in FIG. 13 is provided so as to correspond to the bit IDB00 of the data input to the output data holding circuit OREG1. Circuits similar to the circuit of FIG. 13 are provided so as to correspond to other seven bits of the data which is input to the output data holding circuit OREG1, respectively. Accordingly, eight circuits each as shown in FIG. 13 are provided in the output data holding circuit OREG1.

In the circuit of FIG. 13, a clock-controlled inverter circuit CINV1 is turned ON when the data control signal ITR rises to the "H" level. As a result, the bit IDB00 of the data is output as a bit ROUT00 through the clock-controlled inverter circuits CINV1 and an inverter circuit INV1.

Figure 14:
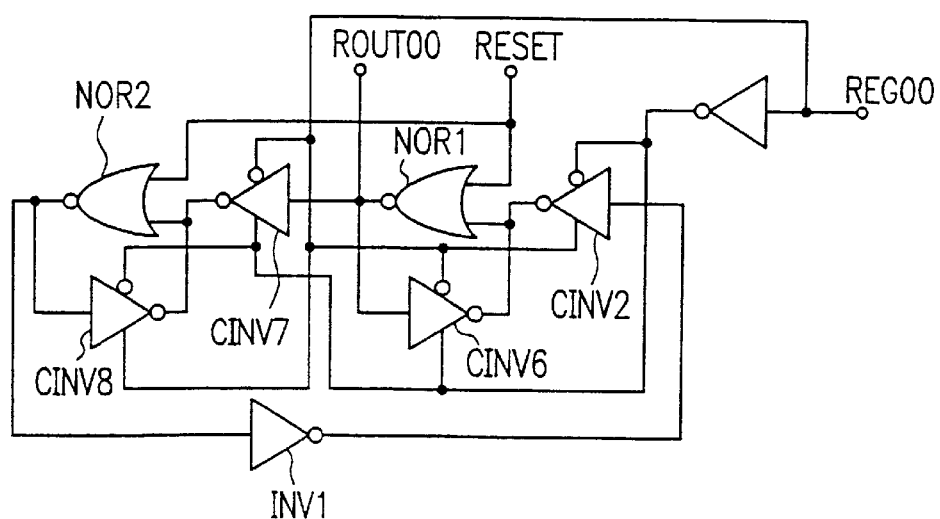
FIG. 14 is a circuit diagram of a structure of a portion of a previous-data holding circuit BDREG of FIG. 12.

FIG. 14 shows a partial structure of the previous-data holding circuit BDREG of FIG. 12. The circuit of FIG. 14 is provided so as to correspond to the selection signal REG00 input to the previous-data holding circuit BDREG. Circuits similar to the circuit of FIG. 14 are provided so as to correspond to other seven selection signals input to the previous-data holding circuit BDREG, respectively.

In the circuit of FIG. 14, an output of a NOR circuit NOR falls to the "L" level when the reset signal RESET rises to the "H" level. At this time, in the case where the selection signal REG00 at the "L" level has been input to the circuit of FIG. 14, inverter circuits CINV6 and CINV7 are turned ON. As a result, an output from the NOR circuit NOR1 (i.e., the bit ROUT00) is retained at the "L" level.

In the case where the selection signal REG00 is inverted to the "H" level, the inverter circuits CINV6 and CINV7 are turned OFF, whereas inverter circuits CINV2 and CINV8 are turned ON. At this time, an output of the NOR circuit NOR2 is at the "L" level. When the output of the NOR circuit NOR2 is input to the NOR circuit NOR1 through an inverter INV1 and the inverter circuit CINV2, the output of the NOR circuit NOR1 is inverted. As a result, the bit ROUT00 rises to the "H" level. Even when the selection signal REG00 is inverted back to the "L" level, the bit IDB10 is held at the "H" level. However, the inverter circuits CINV6 and CINV7 are turned ON, whereas the output of the NOR circuit NOR2 rises to the "H" level.

Moreover, in the case where the selection signal REG00 is again inverted to the "H" level and the inverters CINV2 and CINV8 are turned ON, the output of the NOR circuit NOR2 is at the "H" level, whereby an output of the NOR circuit NOR1 is inverted. As a result, the bit ROUT0 falls to the "L" level.

Figure 15:
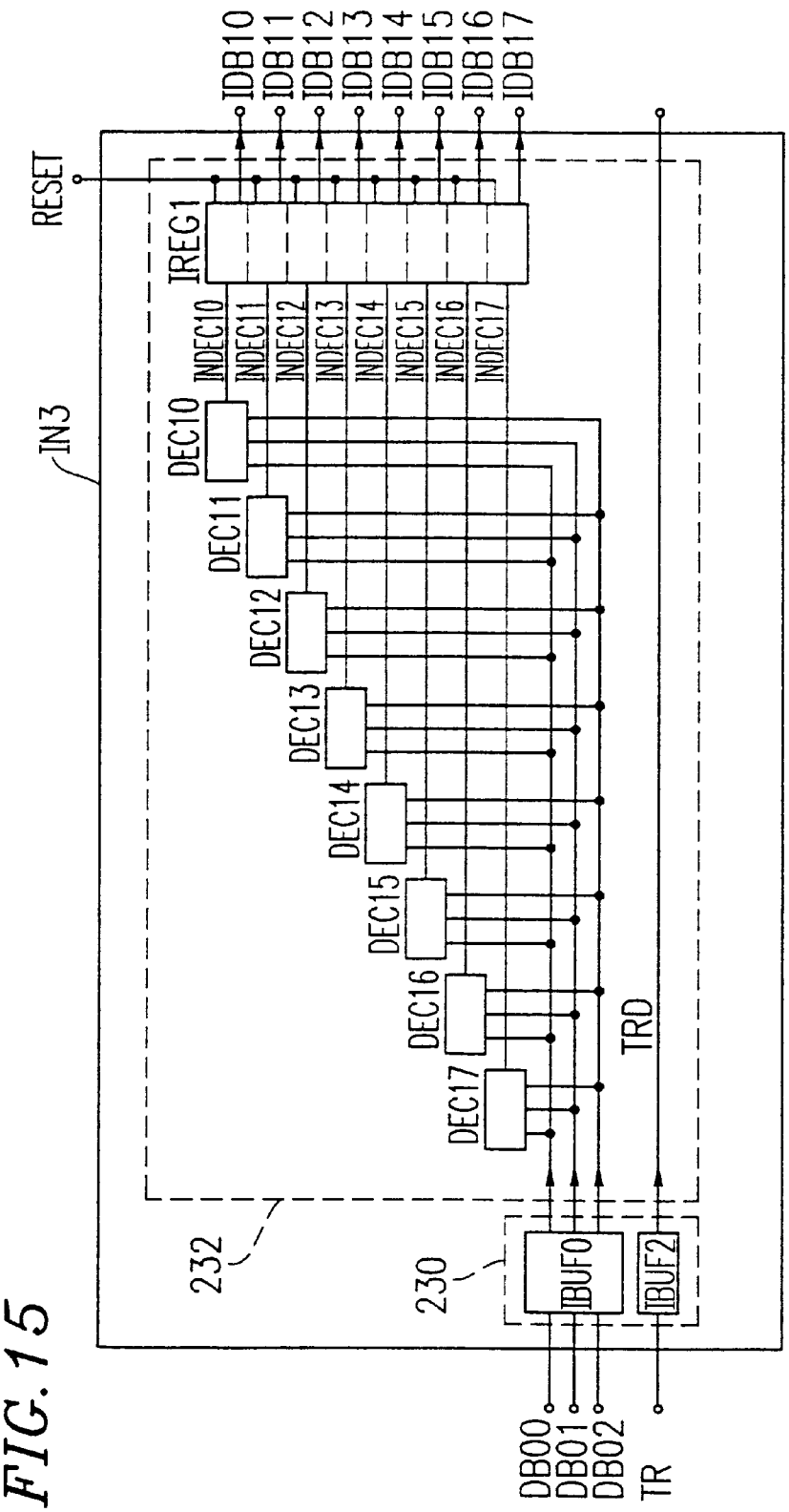
FIG. 15 is a block diagram showing a structure of an input circuit IN3 of a semiconductor chip CHIP3 of FIG. 11.

FIG. 15 shown a structure of the input circuit IN3 of FIG. 12.

The input circuit IN3 encodes 3-bit bit-position information (DB00, DB01, DB02) input to the semiconductor chip CHIP3 into 8-bit data, and outputs the 8-bit data to an internal circuit INT3.

The structure of the input circuit IN3 is substantially the same as that of the input circuit IN1 shown in FIG. 7, except for the structure of the input data holding circuit IREG1. Moreover, the output buffer OBUF1 is eliminated in the input circuit IN3.

It should be noted that, in FIG. 15, elements having the same functions as those of the input circuit IN1 shown in FIG. 7 are denoted by the same reference numerals and characters, and description thereof is omitted for simplification.

In the input circuit IN3, an input data holding circuit IREG1 is first initialized by a reset signal RESET. Thus, each bit of the data held in the input data holding circuit IREG1 is initialized to the "L" level.

The 3-bit bit-position information (DB00, DB01, DB02) transferred from the output circuit OUT2 of the semiconductor chip CHIP2 through the bus 210 is input to the decoding elements DEC10 to DEC17 through the input buffer circuit IBUF0. Every time the 3-bit bit-information (DB00, DB01, DB02) is input, the bit-information (DB00, DB01, DB02) is decoded by a corresponding one of the decoding elements DEC10 to DEC17. As a result, a corresponding one of the bits INDEC10 to INDEC17 rises to the "H" level. The bits INDEC10 to INDEC17 are input to the input data holding circuit IREG.

The input data holding circuit IREG1 has the same structure as that of the previous-data holding circuit BDREG shown in FIG. 14. When the reset signal RESET rises to the "H" level, the bit IDB10 is set to the "L" level. As long as the bit INDEC10 at the "L" level is input from the decoding element DEC10, the bit IDB10 is retained at the "L" level.

When the bit INDEC10 in inverted to the "H" level, the bit IDB10 is also inverted to the "H" level. Even when the bit INDEC10 is then inverted back to the "L" level, the bit IDB10 in retained at the "H" level. However, when the bit INDEC10 is again inverted to the "H" level, the bit IDB10 is inverted back to the "L" level.

Each of the circuits corresponding to the respective bits held in the input data holding circuit IREG1 is as shown in FIG. 14. Each of the circuits is a register circuit in which data is updated (inverted) only when an input rises to the "H" level. Accordingly, except that the data is cleared by initial reset, the data held in each of the circuits is not updated unless the respective input rises to the "H" level. It should be noted that, in the case where an address having a different bit(s) from that of the previously transferred data is transmitted, the decoder circuit outputs an "H"-level bit for each of the different bit(s).

In the input data holding circuit IREG1, the same output is retained for a bit(s) having the same logic value as that of a corresponding bit(s) of the previously transferred data. Accordingly, the entire data can be transferred by merely transferring the bit(s) which is different from the previously transferred data. Thus, the original data can be reproduced by the receiving semiconductor chip CHIP3.

Although the internal data transfer control signal TRD is not shown in FIG. 15, the internal data transfer control signal TRD may be supplied to the internal circuit INT3 of the semiconductor chip CHIP3, so that the bits IDB10 to IDB17 from the input circuit INT3 may be input to the internal circuit INT3 of the semiconductor chip CHIP3 in response to the internal data transfer control signal TRD.

As can be seen from the foregoing, in the semiconductor device 200 of Example 2, 8-bit data is not directly transferred between the semiconductor chips CHIP2 and CHIP3, but the data to be transferred this time is compared with the previously transferred data on a bit-by-bit basis, whereby information indicating a position(s) of a bit(s) having a different logic value from that of a corresponding bit(s) of the previously transferred data is transferred. Thus, the number of signal lines required for data transfer can be reduced. Moreover, since such unnecessary signal lines need not be charged/discharged, data transfer can be conducted more efficiently.

It should be noted that the circuits shown in FIGS. 11 to 15 are by way of illustration only and various modifications can be made to the present invention. Alternatively, instead of these circuits, elements having similar functions may be used.

According to a semiconductor device of the present invention, bit-position information, which indicates a position of at least one bit selected from a plurality of bits contained in the data, is produced, and the bit-position information is transmitted. Therefore, by using the bit-position information having a less number of bits than the number of bits of the data to be transferred, the content of the data is transmitted from a transmitting section to a receiving section. Thus, a bit width of a bus connecting the transmitting section with the receiving section can be made smaller than that of the data to be transmitted. For example, 8-bit data can be transmitted by using a 3-bit bus. As a result, the size of the semiconductor device can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device, comprising:

a transmitting section; and a receiving section, wherein the transmitting section and the receiving section are connected to each other through a bus, the transmitting section includes an encoding section for encoding data including a plurality of bits to produce bit-position information which indicates a position of at least one bit selected from the plurality of bits included in the data, and an output section for outputting the bit-position information onto the bus, and the receiving section includes an input section for receiving the bit-position information from the bus, and a decoding section for decoding the bit-position information to produce the data, wherein the at least one bit is a bit having a specific logic value, the transmitting section further includes a bit-number comparison information producing section for producing bit-number comparison information indicating whether or not a number of bits having the specific logic value is larger than a number of bits having a logic value other than the specific logic value in the plurality of bits included in the data, and the bit-number comparison information producing section is a means to produce a bit showing of whether either a number 1 or a number 0 is larger than the other within the data, the output section outputs the bit-position information and the bit-number comparison information onto the bus, the input section receives the bit-position information and the bit-number comparison information from the bus, and the decoding section decodes the bit-position information based on the bit-number comparison to produce the data.

2. A semiconductor device according to claim 1, wherein the at least one bit is a bit having a different logic value from a logic value of a corresponding bit of previous data.

3. A semiconductor device according to claim 1, wherein the encoding section encodes the data to produce a plurality of pieces of bit-position information, and the output section serially outputs the plurality of pieces of bit-position information onto the bus.

4. A semiconductor device according to claim 1, wherein the bus has a smaller bit width than a bit width of the data.

5. A semiconductor device according to claim 1, wherein another signal lines are provided to transmit the information between the transmitting section and the receiving section.

6. A semiconductor device according to claim 1, wherein a data inversion means is provided within the data transmitting section to perform to convert the data in accordance with the bit showing a result of whether either a number 1 or a number 0 is larger than the other within the data.

7. A semiconductor device, comprising:

a transmitting section; and a receiving section, wherein the transmitting section and the receiving section are connected to each other through a bus, the transmitting section includes an encoding section for encoding data including a plurality of bits to produce bit-position information which indicates a position of at least one bit selected from the plurality of bits included in the data, and an output section for outputting the bit-position information onto the bus, and the receiving section includes an input section for receiving the bit-position information from the bus, and a decoding section for decoding the bit-position information to produce the data, wherein the at least one bit is a bit having a specific logic value, the transmitting section further includes a bit-number comparison information producing section for producing bit-number comparison information indicating whether or not a number of bits having the specific logic value is larger than a number of bits having a logic value other than the specific logic value in the plurality of bits included in the data, and the bit-number comparison information producing section is a means to produce a bit showing of whether either a number 1 or a number 0 is larger than the other within the data, the output section outputs the bit-position information and the bit-number comparison information onto the bus, the input section receives the bit-position information and the bit-number comparison information from the bus, and the decoding section decodes the bit-position information based on the bit-number comparison information to produce the data, and the bus has a smaller bit width than a bit width of the data.

* * * * *